United States Patent [19]

Reiffin

[11] E Re. 29,273

[45] Reissued June 21, 1977

[54] DIRECT-CURRENT-COUPLED TRANSISTOR POWER AMPLIFIERS

[76] Inventor: Martin G. Reiffin, 9 Charles Place, Mahopac, N.Y. 10541

[22] Filed: Mar. 27, 1975

[21] Appl. No.: 562,956

Related U.S. Patent Documents

Reissue of:

[64] Patent No.: 3,376,388
Issued: Apr. 2, 1968
Appl. No.: 654,947
Filed: May 10, 1967

U.S. Applications:

[63] Continuation-in-part of Ser. No. 311,732, Sept. 26, 1963, Pat. No. 3,372,342, and Ser. No. 473,981, July 22, 1965, abandoned, and Ser. No. 501,515, Oct. 22, 1965, abandoned, and Ser. No. 563,586, July 7, 1966, and Ser. No. 388,399, Aug. 10, 1964, abandoned, which is a continuation-in-part of Ser. No. 270,011, April 2, 1963, Pat. No. 3,281,535.

[52] U.S. Cl. ..... 179/1 A; 330/13
[51] Int. Cl.[2] ..... H03F 1/34
[58] Field of Search .....179/1 A, 1 F; 330/13, 15

[56] References Cited

OTHER PUBLICATIONS

Tobey & Dinsdale, "Transistor Audio Power Amplifier", Wireless World, Nov. 1961, pp. 565–570.
Tobey & Dinsdale, "Transistor Audio Power Amplifier", Wireless World, Feb. 1962, pp. 69–70.
Faran & Fulks, "High Impedance Drive for Elimination of Crossover Distortion", IRE Transactions on Audio, July–Aug. 1962, pp. 99–105.
D. W. Slaughter, "Feedback–Stabilized Transistor Amplifier", Electronics, May 1955, pp. 174, 175.
Robert S. Burwen, "A Transistorized 200–Watt Stereo Amplifier", Audio, Nov. 1962, pp. 40–52.

*Primary Examiner*—Kathleen H. Claffy
*Assistant Examiner*—Gerald L. Brigance

[57] ABSTRACT

A transistor power amplifier is provided with direct-current-coupling between stages and to the loudspeaker. The output stage is push-pull single-ended and includes two transistors connected in series at a midpoint of the stage. A split power supply has a center-tap connected to one output terminal and the other output terminal is connected to said output stage midpoint. Amplification and drive stages are direct-current-coupled in cascade to the output stage. A direct-current negative feedback network extends from the output stage to an amplification stage to maintain the output terminals at substantially the same quiescent potential to prevent direct-current flow through the voice-coil of the loudspeaker.

58 Claims, 15 Drawing Figures

INVENTOR.

Martin G. Reiffel

INVENTOR
MARTIN G. REIFFIN

Martin G. Reiffin

INVENTOR.

Martin G. Reiff

FIG. 2a
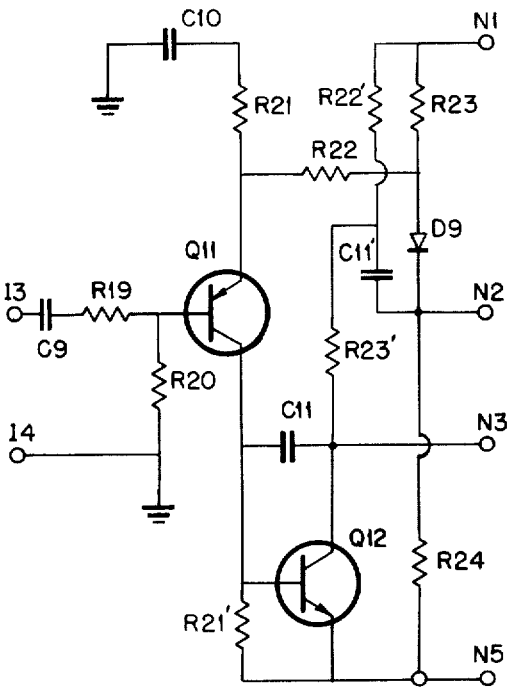
FIG. 3a
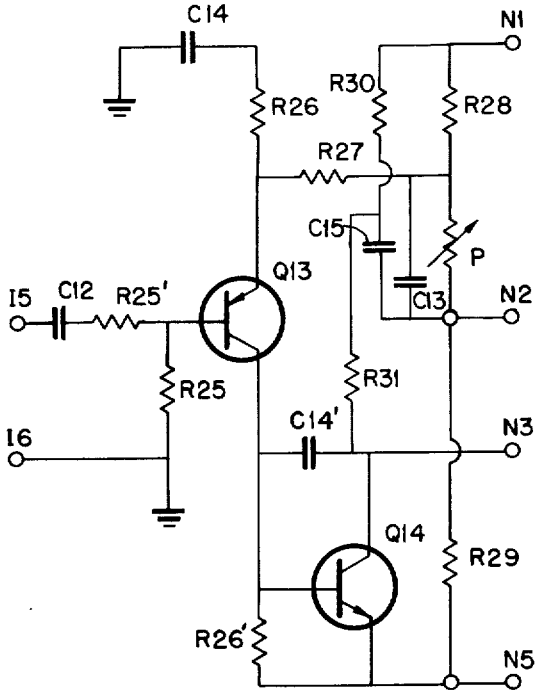
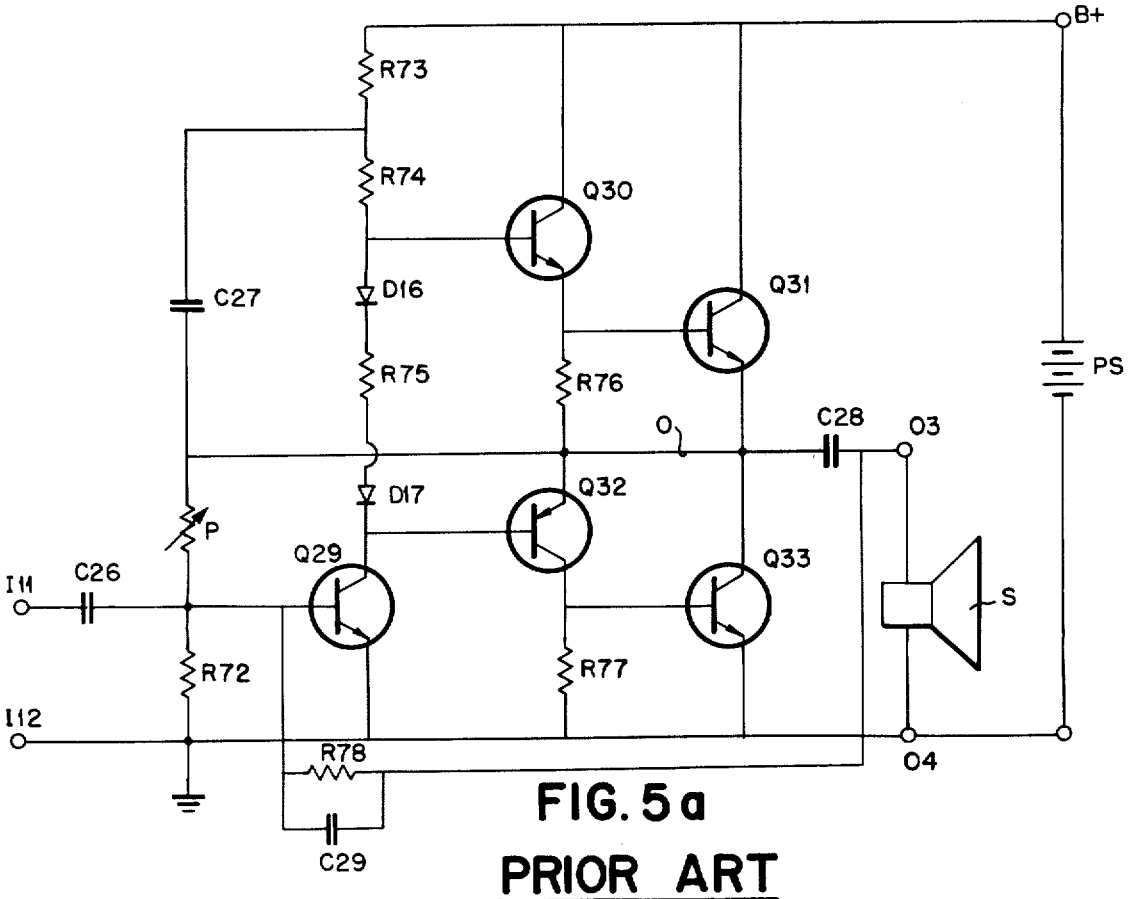
FIG. 5a
PRIOR ART

INVENTOR.

Martin G. Piffi

INVENTOR.

Martin G. Reiffin

INVENTOR.

Martin G. Reiffin

DIRECT-CURRENT-COUPLED TRANSISTOR POWER AMPLIFIERS

Matter enclosed in heavy brackets [ ] appears in the original patent but forms no part of this reissue specification; matter printed in italics indicates the additions made by reissue.

CROSS-REFERENCES

This application is related to my prior applications listed below:

"Transistor Power Amplifiers," Ser. No. 270,011, now U.S. Patent No. 3,281,535, filed Apr. 2, 1963; "Transistor Power Amplifiers and Feedback Speaker Systems Embodying Same," Ser. No. 311,732, *now U.S. Pat. No. 3,372,342*, filed Sept. 26, 1963; "Transistor Power Amplifiers and Feedback Systems Embodying Same," Ser. No. 388,399, filed Aug. 10, 1964; "Transistor Power Amplifiers for High Fidelity Music Reproduction," Ser. No. 563,586, filed July 7, 1966 [.] ; *"Transistor Audio Amplifier with Power-Division Output Stages", Ser. No. 501,515, filed Oct. 22, 1965, now abandoned. "Transistor Power Amplifiers With Protective Circuit Means", Ser. No. 473,981, filed July 22, 1965.*

The present application is a continuation-in-part of said applications *Ser. No. 501,515*, Ser. No. 311,732; Ser. No. 388,399 now abandoned; *Ser. No. 473,981 now abandoned* and Ser. No. 563,586. Said application Ser. No. 388,399 is in turn a continuation-in-part of said application Ser. No. 270,011 now U.S. Pat. No. 3,281,535.

FIELD OF THE INVENTION

This invention relates to transistor power amplifiers for high-fidelity music reproduction and other applications where high power output and inaudible amplifier distortion under rigorously critical listening conditions are required.

DESCRIPTION OF THE PRIOR ART

In the prior state of the art, the advent of transistors, with their ability to function efficiently when loaded by the relatively low impedance of a loudspeaker, made feasible the elimination of the output transformer from audio amplifiers. Since the output transformer was by far the most expensive component and generated the most distortion, phase shift and feedback instability, its elimination would have provided a substantial advance if it were not for the fact that prior transistor amplifier circuits substituted other components which were almost as disadvantageous.

More specifically, one widely adopted design approach provides direct coupling between the output stage and the loudspeaker, but utilizes a driver transformer to drive the output transistors. The primary of the driver transformer is capacitor-coupled to ground. Another prior art solution involves direct coupling the drive stage to the output stage but coupling the latter to the loudspeaker through a large electrolytic capacitor. Both of these circuit types frequently employ interstage coupling capacitors as well.

Instead of utilizing these reactive coupling components, the amplifier circuit of the present invention provides direct coupling between the several stages, to the loudspeaker, and throughout the feedback loop. In addition to the obvious advantages of reduced cost and greater reliability due to the elimination of transformers and coupling capacitors, the primary advantage of the present direct-coupled circuit resides in the elimination or substantial reduction of the following forms of distortion which are generated by or inadequately reduced by the conventional circuits:

(1) Nonlinear distortion.—Driver transformers and coupling capacitors produce phase shift at both frequency extremes so as to prevent the application of a large amount of feedback with stability. Nonlinear distortion, including both harmonic and intermodulation distortion due to nonlinear transistor transfer characteristics, is reduced in an amount proportional to the amount of feedback. The restriction to a moderate amount of feedback, necessary for stability in the conventional circuits, results in a substantial residuum of nonlinear distortion.

(2) Oscillatory response.—At low frequencies this is known as "breathing" and at high frequencies as "ringing." In either case, the complex poles of the transfer function provide a spurious oscillatory response if the amount of feedback is excessive in view of the phase shifts provided by the reactive coupling components of the conventional circuits. The designer of the latter is faced with the dilemma of risking this form of distortion or settling for a substantial amount of nonlinear distortion by utilizing only a moderate amount of feedback to obtain a greater stability margin.

(3) Overload recovery.—At overload peaks when one or more transistors go into saturation, it is usual for at least one interstage coupling capacitor to pass a large unidirectional surge of current so as to change its state of charge. After the overload signal terminates it takes the capacitor a finite time to recover its original charge condition. During this recovery period the bias on the succeeding amplification stage is usually sufficiently disturbed by the potential applied thereto by the capacitor so as to cause either radical distortion or even complete cutoff known as "blocking."

(4) Crossover distortion.—Although inherent in any transistor push-pull output stage operating near the Class B bias mode, this type of distortion is reduced approximately in proportion to the amount of feedback, provided the distortion is not so severe as to reduce the amplifier gain to the point where the feedback is ineffective. As in the case of nonlinear distortion, the phase shifts generated by the reactive coupling components of the conventional circuits prevent the application with stability of a large amount of feedback and hence the residual crossover distortion is usually excessive.

(5) Transient distortion.—Although this term is sometimes applied to various forms of spurious response to nonsinusoidal period signals such as square waves, it is intended here to refer to distortion arising from non-periodic pulse signals. One form produces premature clipping at the rise of a tone burst due to a disturbance in the bias condition of an early stage and produced by a low-frequency instability triggered by the burst. Another form occurs during the recovery from a heavy pulse having a substantial direct-current component which changes the charge condition of a coupling capacitor, usually the output capacitor which couples to the speaker rather than an interstage capacitor as in the case of overload recovery distortion.

(6) Bias drift.—Varying thermal and load conditions and changes in component parameters may cause a drift of the quiescent operating point of one or more stages, resulting in premature clipping at power levels lower than rated. The use of reactive coupling in the conventional circuits usually prevents the application of a large amount of overall direct-current feedback which would counteract any tendency of the bias point to drift from the optimum value.

(7) Transformer crossover transients.—If the two halves of a driver transformer primary winding are not perfectly coupled, crossover switching transients in the form of notches or ringing will occur, particularly when abetted by carrier storage at high frequencies. Trifilar windings increase the coupling and thus reduce these transients, but do not completely eliminate them.

(8) Reactive coupling loads.—The use of an output coupling capacitor results in an elliptical load-line for the amplifier at low frequencies, and the primary inductance of a driver transformer provides a similar reactive load for the drive stage. In response to low-frequency transient signals the operating point of the output stage may enter regions of simultaneously high voltage and current so as to result in "second breakdown" causing the destruction of the output transistors.

SUMMARY OF THE INVENTION

It is therefore a primary object of the present invention to provide novel transistor power amplifier circuits wherein the pre-drive, drive and output stages are D.C.-coupled to each other and the output stage is D.C.-coupled to the loudspeaker, so as to eliminate the serious disadvantages inherent in the use of driver transformers and output coupling capacitors. Prior art circuits having the last two or three stages D.C.-coupled in this manner have heretofore been unsuccessful because they are deficient in one or more of the following respects:

(1) There was an inability to maintain D.C. balance at the amplifier output terminals under varying ambient temperatures, line voltages and output power loads. Any substantial D.C. unbalance produces a D.C. current in the loudspeaker voice-coil thereby biasing the cone off center and increasing the speaker distortion.

(2) The power supply ripple was injected into an early stage of the amplifier thereby producing an excessive amount of hum.

(3) The power and distortion characteristics did not compare favorably with other circuits.

(4) Some of the circuits were complex and critical and therefore costly and unreliable.

(5) Failure of an output transistor was likely to damage the loudspeaker so as to require factory replacement of the cone and voice-coil at substantial expense.

(6) Although measuring extremely well on distortion meters in laboratory bench tests they generated audible distortion when subjected to music signals in critical listening tests.

It is therefore a further object of the present invention to obviate the above-noted defects heretofore prevalent in D.C.-coupled amplifier circuits.

The attainment of practical, and properly functioning circuitry wherein the pre-drive, drive and output stages are D.C.-coupled to each other and to the loudspeaker provides an amplifier having phase shift characteristics which permit the use of new and more effective feedback techniques and impedance matching arrangements.

In one embodiment an inner negative feedback loop raises the high-frequency cutoff of the amplifier to a predetermined frequency, and preceding the inner loop is a preamplifier stage having a high-frequency cutoff substantially lower than said predetermined frequency. An outer negative feedback loop includes both the amplifier and the preamplifier stage. The result is an unusually large amount of feedback without instability.

Other objects and advantages are either inherent in the circuitry disclosed herein or will become apparent to those skilled in the art as the detailed description proceeds in connection with the accompanying drawings wherein:

DESCRIPTION OF THE DRAWINGS

FIG. 2a shows a modification of the first two stages of the circuit of FIG. 1a;

FIG. 3a shows another modification of said first two stages of the circuit of FIG. 1a;

FIG. 5a shows a widely-used prior art circuit utilizing an output coupling capacitor.

DETAILED DESCRIPTION

Figure 1:
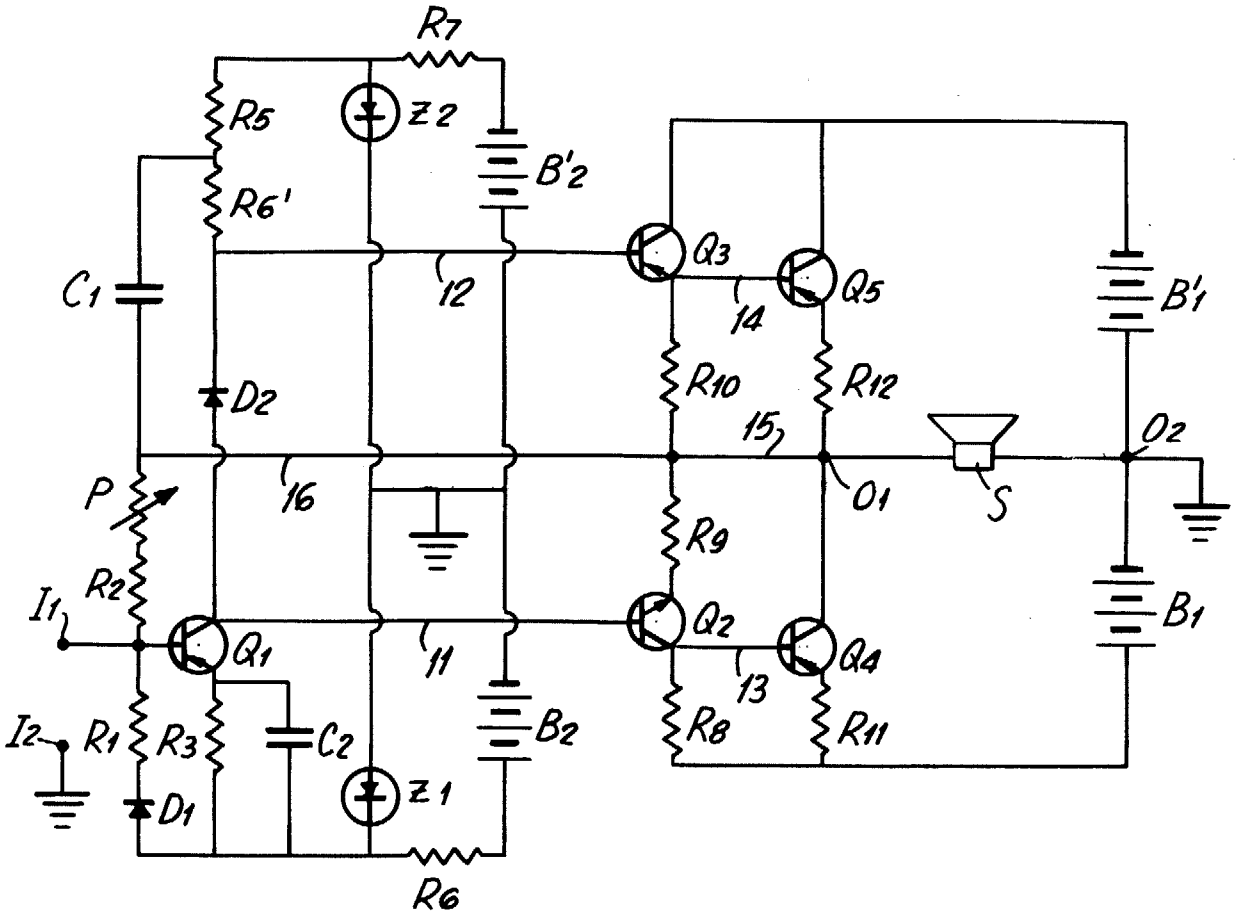
FIG. 1 is an amplifier circuit embodying the invention.

Referring now to the drawings in more detail and first to FIG. 1 thereof, there is shown an amplifier circuit in accordance with the present invention and comprising a voltage amplification or pre-drive stage including transistor Q1, a complementary symmetry push-pull drive stage including transistors Q2 and Q3, and a push-pull power output stage including transistors Q4 and Q5. Each stage is D.C.-coupled to the next stage and the output stage is in turn D.C.-coupled to the loudspeaker S. The pre-drive transistor Q1 is operated common-emitter in Class A. The drive and output stages operate as emitter-follower Darlington pairs and are preferably biased in Class AB with sufficient quiescent current to minimize crossover distortion.

Transistor Q1 is provided with a base biasing circuit comprising the series arrangement of diode D1, resistor R1, resistor R2, and a variable resistor in the form of a potentiometer P. The base of transistor Q1 is connected to the junction of resistors R1, R2. The emitter of transistor Q1 is provided with a bias resistor R3 which is bypassed by a capacitor C2. The collector of transistor Q1 is connected to one end of a diode D2 having its opposite end connected to collector load resistors R5, R6'. Capacitor C1 has one end connected to output terminal O1 through leads 15, 16 and its opposite end connected to the junction of resistors R5, R6' to provide bootstrapping in the conventional manner.

The battery symbols B2 and B'2 designate the half-sections of a conventional auxiliary power supply having its center-tap grounded as shown. A resistor R6 has one end connected to the positive terminal of the positive half-section B2 of the power supply and its opposite end is connected to the positive end of a zener reference diode Z1. The negative end of the latter is connected to ground. The lower ends of diode D1, resistor R3 and bypass capacitor C2 are connected to the positive end of zener diode [D1] *Z1*.

A resistor R7 has one end connected to the negative end of the negative half-section B'2 of the auxiliary power supply and its opposite end is connected to the negative end of a second zener reference diode Z2 having its positive end connected to ground. The upper end of collector load resistor R5 is connected to the negative end of zener diode [D2] *Z2*.

The potential of the positive terminal of power supply positive section B2 is more positive than the breakdown voltage of zener diode Z1 so that the latter is maintained in its breakdown state with its positive end at a substantially fixed predetermined voltage with respect to ground. Similarly, the negative terminal of power supply negative section B'2 is maintained at greater negative potential than the breakdown voltage of zener diode Z2 so that the latter is maintained in the breakdown state with its negative end at a fixed predetermined negative voltage with respect to ground. Therefore the base, emitter and collector circuits of transistor Q1 are connected to potential sources at fixed predetermined voltages which remain substantially invariant under different conditions of ambient temperature, line voltage and amplifier load.

The collector of transistor Q1 is D.C.-coupled by lead 11 to the base of the lower NPN transistor Q2 of the complementary drive stage and the upper end of diode D2 is similarly D.C.-coupled by lead 12 to the base of the upper PNP transistor Q3 of said drive stage. Bias resistors R9, R10 extend from the respective emitters of transistors Q2, Q3 to a common junction connected by lead 15 to the output terminal Q1. The collector of the lower NPN transistor Q2 is D.C.-coupled by lead 13 to the base of the lower output transistor Q4 and the emitter of the upper PNP drive transistor Q3 is D.C.-coupled by lead 14 to the base of the upper output transistor Q5.

Resistor R8 has one end connected to the collector of drive transistor Q2 and its opposite end is connected to the positive terminal of the positive half-section B1 of a main split power supply having a negative half-section B'1 with a negative terminal connected to the collectors of both upper drive transistor Q3 and upper output transistor Q5. The center-tap of the main power supply B1, B'1 is grounded as shown and constituted the grounded output terminal O2 whereby the speaker S may be connected with its voice-coiled terminals D.C.-coupled to the respective amplifier terminals O1, O2.

The emitter of the lower output transistor Q4 is provided with a bias resistor R11 extending to the positive terminal of the positive power supply section B1 and its collector is connected to output terminal O1. The emitter of upper output transistor Q5 is similarly provided with a bias resistor R12 extending to output terminal O1.

The two signal input terminals are indicated at I1, I2. Input terminal I1 is connected directly to the base of transistor Q1 whereas input terminal I2 is grounded as shown. Transistor Q1 operates as a Class A common-emitter amplifier stage and the potential of its collector varies in response to a signal fed to input terminals. I1, I2. Diode D2 provides a temperature-compensated bias for drive transistors Q2, Q3 in the conventional manner.

Due to the small voltage drop across diode D2 the potential of lead 12 will be maintained a fraction of a volt more negative than the collector of transistor Q1 as the collector swings in response to a signal input. The complementary drive stage Q2, Q3 provides both phase inversion and emitter-follower operation. That is, since the emitter of a transistor operating in the active region remains within a fraction of a volt of the base, it will be seen that the potential of the junction of emitter resistors R9, R10, and hence that of the output terminal O1, will be maintained intermediate the respective potentials at the opposite ends of diode D2 as the latter swings up and down with the collector of transistor Q1. Thus the potential of amplifier output terminal O1 will be maintained within a fraction of a volt of the potential of the collector of transistor Q1 so as to provide the low distortion of emitter-follower operation.

In view of the D.C.-coupling of the amplifier to the loudspeaker S, it is imperative that the output terminals O1, O2 be maintained at substantially the same D.C. potential, both under quiescent condition and at various levels of power output, and irrespective of variations in ambient temperature and line voltage. Any D.C. unbalance between output terminals O1, O2 will cause a direct current to flow through the voice-coil of loudspeaker S. This in turn will cause the cone of loudspeaker S to be biased off center. If the direct current and the resultant biasing are substantial, the nonlinear distortion generated by the loudspeaker will be seriously increased.

Output terminal O1 is maintained at substantially the same potential as output terminal O2, that is, at ground potential, by two feedback arrangements. The first comprises the emitter bias resistor R3 of transistor Q1 which is made highly effective by zener diode Z1. The breakdown voltage of zener diode Z1 is selected so as to be substantially larger than the quiescent collector-to-emitter voltage of transistor Q1 so that the extra voltage may be dropped across resistor R3. The resistance of the latter may thus be many times larger than is customary or would be permissible in the absence of zener diode Z1.

For example, in conventional prior art circuits of the complementary-symmetry type wherein the lower ends of resistors R3, R8 and R11 are connected to a common ground, the resistor in the relative position of R3 is generally about a few hundred ohms. Any attempt to increase this resistance substantially will cause a corresponding reduction in the available voltage swing of the collector of Q1 and hence in the maximum power output capability of the amplifier. However, if the breakdown voltage of zener diode Z1 is selected so as to be a predetermined amount (e.g., about ten volts) greater than the voltage of the positive terminal of the main power supply section B1 then resistor R3 may have this voltage difference dropped across it. Hence, for the same emitter current, resistor R3 may be of a magnitude of several thousand ohms, that is, approximately ten times larger than in the conventional prior art circuits, without any reduction in the collector voltage swing or the amplifier maximum power output.

Since resistor R3 provides D.C. feedback which stabilizes the collector current of transistor Q1 and hence the potential of the collector of transistor Q1, by increasing the magnitude of this resistor ten-fold, the feedback is increased by the same amount and hence the stability of the D.C. potential of output terminal O1 is increased by a like amount.

The second feedback arrangement for the latter purpose is provided by the base bias circuit including elements [D1] *Z1*, R2 and P. The potentiometer P and resistor R2 together with leads 15 and 16 provide a D.C. feedback path extending from output terminal O1 to the base of transistor Q1. This feedback is degenerative so that it counteracts any tendency of output terminal O1 to vary in D.C. potential. Potentiometer P further provides a convenient arrangement for initially adjusting the potential of output terminal O1 so that it is at ground potential and thus balanced with respect to the grounded output terminal O2.

The D.C. feedback provided by potentiometer P and resistors R1, R2 is aided by zener diode Z1 in two important respects. First, the predetermined invariant potential provided by zener diode [D1] *Z1* constitutes a fixed reference voltage which the feedback arrangement utilizes as a comparison standard to detect and correct errors in the D.C. potential of output terminal O1. Second, the potential source arrangement of zener diode [D1] *Z1* provides a large potential drop across the lower base bias resistor R1 and hence the latter may be many times larger than is conventional. Since the amount of D.C. feedback is determined by the ratio of the magnitude of resistor R1 to the sum of the magnitudes of resistors R1, R2 and potentiometer P, the greatly increased value of R1 results in a substantially larger amount of D.C. feedback and hence greater effectiveness in maintaining the D.C. potential output terminal O1 fixed at ground level.

Further precision in this regard is provided by diode D1 which serves as a temperature compensating element to counteract the variations in the base-to-emitter voltage of transistor Q1 with variations in ambient temperature. The temperature compensating operation of diode D2 is well-known in the art and similarly counteracts the variation in base-to-emitter voltage of drive transistors Q2, Q3 and output transistors Q4, Q5 with variations in ambient temperature.

It will be seen that variations in amplifier load will have practically no effect on the D.C. balance of output terminals O1, O2. That is, as the load increases the regulation of the main power supply B1, B'1 will cause the voltage across its terminals to decrease substantially due to the internal impedance of the supply. The center-tap at O2 will remain at the same potential since it is grounded and the respective potentials at the opposite ends of the power supply will shrink toward ground as the load on the amplifier is increased.

However, the D.C. potential of output terminal O1 will remain substantially unaffected for the following reasons. The potential of output terminal O1 is determined by the potential of the collector of transistor Q1. Zener diodes Z1, Z2 maintain the lower end of emitter resistor R3 and the upper end of collector resistor R5 at substantially constant fixed voltages irrespective of variations in the load on the amplifier. Hence the D.C. potential of the collector of transistor Q1 remains substantially constant, and thus the D.C. potential of output terminal O1 is maintained at ground potential under varying load conditions.

For the same reasons, variations in line voltages will not disturb the D.C. balance of output terminals O1, O2 provided that the line voltage be at least the minimal value required to cause the voltages of the auxiliary power supply sections B2, B'2 to be greater than the respective breakdown voltages of zener diodes Z1, Z2 so that the latter may operate in their proper breakdown regions.

The D.C.-coupling between the three high level stages and between the output stage and the loudspeaker provides several important advantages, the foremost probably being the phase shift characteristics which permit degrees and techniques of feedback not possible with conventional transformer and capacitor coupling arrangements. At low frequencies the D.C.-coupling introduces no phase shift whatever. In addition, the relatively large resistance of emitter resistor R3 further improves the low frequency stability margin in any feedback arrangement by providing substantial degeneration and consequent large gain reduction at extreme low frequencies where the bypass capacitor C2 becomes effectively open.

At high frequencies the large feedback stability margin made possible by the emitter-follower operation and Darlington pair arrangement of the last two stages is further augmented by the complete elimination of stray capacitances due to coupling capacitors and transformers, as well as leakage inductance of the latter. The feedback techniques made available by these greatly improved phase shift characteristics are described hereinbelow.

Another advantage of the D.C.-coupling arrangement resides in the improved overlaod recovery characteristics due to the absence of any interstage coupling capacitors preceding a high level stage. In prior amplifier circuits having such capacitors, overloading of the stage caused a large current to flow through the capacitor so as to change its voltage. This caused the stage to be improperly biased, and most such amplifiers generated severe distortion or even blocked completely for a short period until the capacitor recovered its normal voltage and the bias resumed its proper value.

Still another advantage of the D.C.-coupling arrangement is the reduction of the tendency to second breakdown of the output transistors. The mechanism of second breakdown is not completely understood but is believed to result from the simultaneous occurrence in the transistor of high instantaneous voltage and high instantaneous current. It is probable that in most instances this condition occurs because of the reactive nature of the load at low frequencies when an output coupling capacitor is employed between the output stage and the loudspeaker.

Still another advantage of the present invention resides in the complete isolation of the ripple of the main power supply B1, B'1 from the voltage amplification stage comprising transistor Q1. The auxiliary power supply B2, B'2 has negligible ripple, even under heavy amplifier load, because it supplies a very small current which remains small due to the Class A operation of Q1. Also, any residual ripple is smoothed out by the filtering action of the zener diodes.

A further advantage of the D.C.-coupling resides in the impedance matching of the amplifier to the load. The usual 1,000 microfarad output coupling capacitor has at 20 cycles per second twice the impedance of a four-ohm loudspeaker, and hence the maximum power capability of the amplifier is greatly reduced when driving such a loudspeaker. This defect is entirely obviated by the present D.C.-coupling to the speaker.

Furthermore, the present invention makes feasible a modular arrangement whereby two amplifier sections may be selectably connected in either a parallel mode to match low impedance speakers (e.g., four ohms) or in a series mode to match high impedance speakers, such as sixteen ohms.

The price to be paid for the D.C.-coupling arrangement of the disclosed embodiment is rather small in view of the substantial advantages noted above. The auxiliary power supply B2, B'2 supplies only a few milliamperes and hence is relatively inexpensive. It may comprise an extra winding or tap on the power transformer of the main power supply B1, B'1 so as to obviate the need for an extra transformer. It is to be understood that other voltage reference means may be substituted for the zener diodes. For example, there may be utilized other types of breakdown components such as gas tubes, or ordinary D.C. batteries, or the auxiliary power supply B2, B'2 may be of the regulated type. However, the zener diode arrangement disclosed is simpler, less expensive and more reliable than these other expedients.

Figure 2:
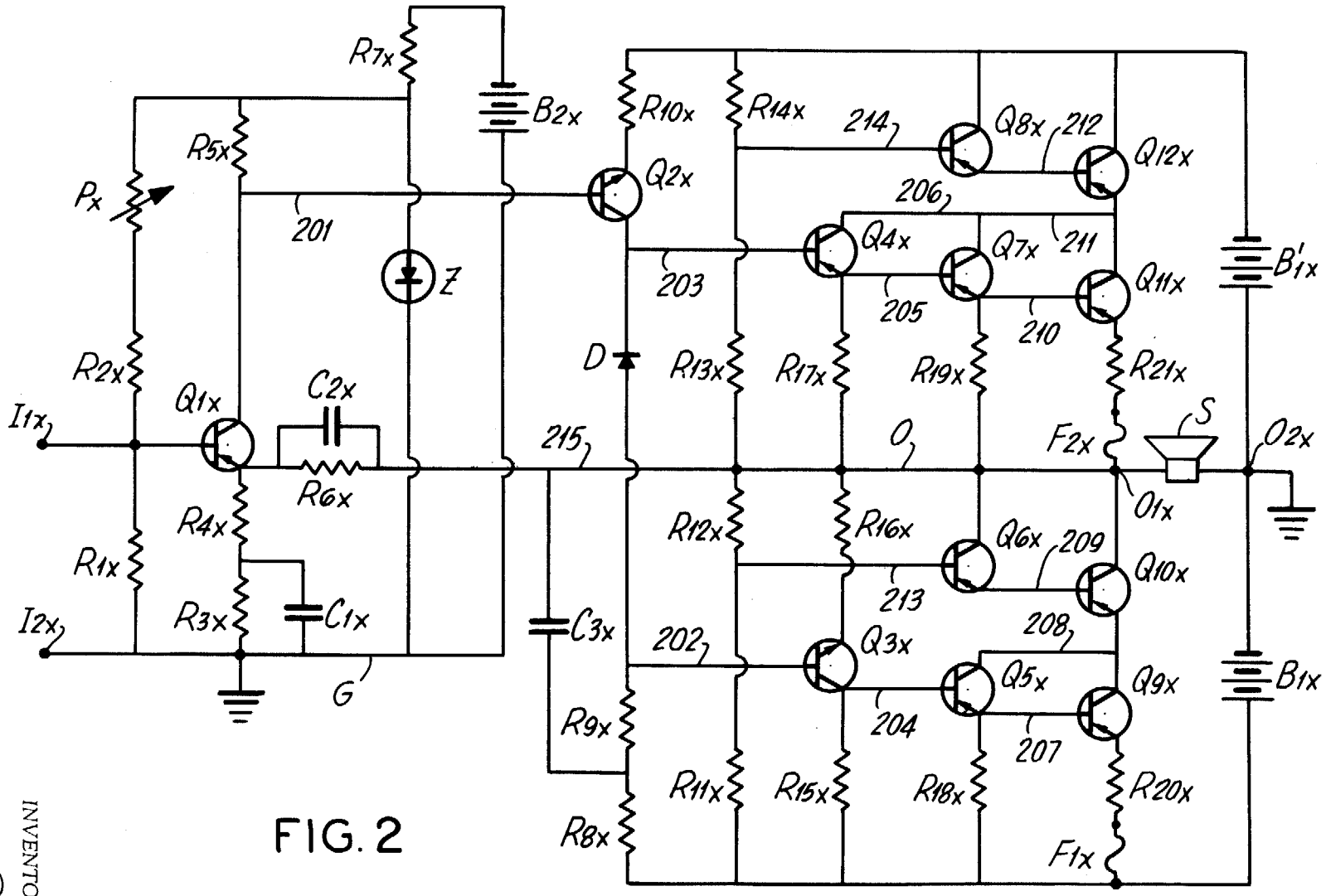
FIG. 2 shows a modified form of the invention which uses only a single zener diode and a non-split auxiliary power supply, and which also includes an additional four-transistor drive stage having two transistors driven by the output stage through feedback voltage dividers energized by the latter.

Referring now to FIG. 2, there is disclosed another modified form of the invention wherein the pre-drive stage is directly connected to the main power supply and utilizing only a non-split auxiliary power supply and a single zener diode.

In more detail, the amplifier of FIG. 2 comprises a first pre-drive stage including a transistor Q1x operating in the Class A common-emitter mode. The base of transistor Q1x is connected to the input terminal I1x, the other input terminal I2x being grounded as shown. The base is biased by resistors R1x, R2x and potentiometer Px. The emitter of transistor Q1x is provided with two bias resistors R3x, R4x. The lower resistor R3x is bypassed by a capacitor C1x whereas the upper resistor R4x is unbypassed, for a purpose to be described. The collector of transistor Q1x is connected to the lower end of a load resistor R5x.

A zener diode Z has its positive end connected to ground and its negative end is connected to the upper end of collector load resistor R6x and the upper end of potentiometer Px whereby the collector and the base bias circuits are energized by a potential source which is maintained at a predetermined fixed voltage independent of the variations in amplifier load, line voltage and ambient temperature. The negative end of zener diode Z is connected by resistor R7x to the negative terminal of an auxiliary power supply B2x having its positive terminal connected to the ground bus G.

The second pre-drive stage comprises an NPN transistor Q2x also operating in the Class A common-emitter mode. The base of transistor Q2x is direct-coupled by lead 201 to the collector of the first pre-drive transistor Q1x. The emitter of transistor Q2x is connected through a bias resistor R10x to the negative terminal of the negative section B'1x of the split main power supply indicated schematically by the battery symbols. The collector of transistor Q2x is connected to the upper end of a temperature compensating bias diode D having its lower end connected to the series-connected load resistors R8x, R9x. A conventional bootstrapping capacitor C3x has its lower end connected to the junction of collector load resistors R8x, R9x and its upper end is connected through lead 215 to the output bus O.

The circuit of FIG. 2 comprises two drive stages, the first drive stage being the complementary symmetry type and including an NPN drive transistor Q3x and a PNP drive transistor Q4x. Bias resistors R16x, R17x extend from the respective emitters of transistors Q3x, Q4x to output bus O. The collector of NPN drive transistor Q3x is connected by transistor R15x to the positive terminal of the positive section B1x of the main power supply.

The second drive stage comprises four PNP transistors Q5x, Q6x, Q7x, Q8x. The base of the lowermost drive transistor Q5x is direct-coupled by lead 204 to the collector of transistor Q3x and the base of drive transistor Q7x is direct-coupled by lead 205 to the emitter of transistor Q4x. Resistor R18x extends from the emitter of drive transistor Q5x to the positive terminal of power supply section B1x and resistor R19x extends from the emitter of drive transistor Q7x to the output bus O. The collector of transistor Q6x is connected to the output bus O and the collector of transistor Q8x is connected to the negative terminal of the negative B'1x of the main power supply.

The potential of the base of drive transistor Q6x is maintained midway between the potentials of [ground] *output* bus O and the positive terminal of the power supply by a feedback network energized by the output of the amplifier and comprising the voltage divider resistors R11x, R12x arranged in series from the power supply positive terminal to the output bus O. The base of transistor Q6x is connected by lead 213 to the junction of voltage divider resistors R11x, R12x. The resistance values of the latter are preferably approximately equal.

In a similar manner the potential of the base of drive transistor Q8x is maintained approximately midway between the potentials of output bus O and the power supply negative terminal by means of a feedback network comprising the voltage divider resistor R13x, R14x extending from output bus O to the power supply negative terminal. The base of drive transistor Q8x is connected by lead 214 to the junction of resistors R13x, R14x. The resistance values of the latter are also preferably approximately equal. As a result, the transistors of both the second drive stage and the output stage will share approximately equally both the quiescent D.C. potentials and the varying A.C. potentials as the output bus O swings in response to a signal input to the amplifier.

The output stage of the circuit of FIG. 2 comprises four power transistors Q9x, Q10x, Q11x, Q12x arranged in series. The emitter of the lowermost output transistor Q9x is connected through bias resistor R20x and fuse F1x to the power supply positive terminal and its collector is connected to the emitter of the next higher output transistor Q10x. The collector of the latter is connected to the output terminal O1x to which the emitter of output transistor Q11x is also connected through the bias resistor R21x and fuse F2x. The collector of output transistor Q11x is connected to the emitter of the uppermost output transistor Q12x, the latter having its collector connected to the power supply negative terminal.

The second drive stage is direct-coupled to the output stage in the following manner so as to form four Darlington compound pairs. The emitter of each of the second drive stage transistors Q5x, Q6x, Q7x, Q8x is direct-coupled by one of the leads 207, 208, 209, 210, 212 to the base of a respective one of the output transistors Q9x, Q10x, Q11x, Q12x. The collector of the first drive stage transistor Q4x is connected by lead 206 to the collector of the second drive stage transistor Q7x which is in turn connected by lead 211 to the collector of output transistor Q11x. The collector of drive transistor Q5x is connected by lead 208 to the collector of output transistor Q9x.

Output terminal O1x is directly connected to the midpoint of the output stage at the collector of transistor Q10x. The other output terminal O2x is grounded as shown. Hence the loudspeaker S is D.C.-coupled to the amplifier so as to provide all of the advantages inherent in this arrangement and discussed above with respect to the circuit of FIG. 1. In order to maintain the output terminals O1x, O2x at the same D.C. potential so as to prevent the flow of D.C. current in the voice-coil of the loudspeaker, there are provided two feedback systems.

The first feedback system arises from the degeneration inherent in the resistors R3x, R4x in the emitter circuit of transistor Q1x. These resistors counteract any tendency for the collector current of transistor Q1x to vary with changes in temperature. The zener diode Z maintains the upper end of collector load resistor R5x and the upper end of potentiometer Px at a substantially fixed voltage. Therefore the potential of collector Q1x is maintained substantially constant and hence the D.C. potential applied to the base of the second predrive transistor Q2x remains substantially fixed.

The second feedback system for maintaining output terminals O1x, O2x at the same D.C. potential comprises a D.C. feedback network extending from the output O1x to the emitter of the first transistor Q1x. This network includes a feedback resistor R6x, connected in parallel with the usual phase-advance capacitor C2x, and having one end connected to output O1x and its opposite end connected to the emitter of transistor Q1x. This feedback network is degenerative so as to counteract any tendency of D.C. voltage of output O1x to vary from ground potential. This feedback network also serves the additional function of providing A.C. negative feedback for the usual purposes of reducing distortion, improving frequency response, and reducing the output impedance of the amplifier. In order to reduce the A.C. feedback to an amount which will provide an adequate stability margin the lower emitter resistor R3x is bypassed by the capacitor C1x.

Figure 3:
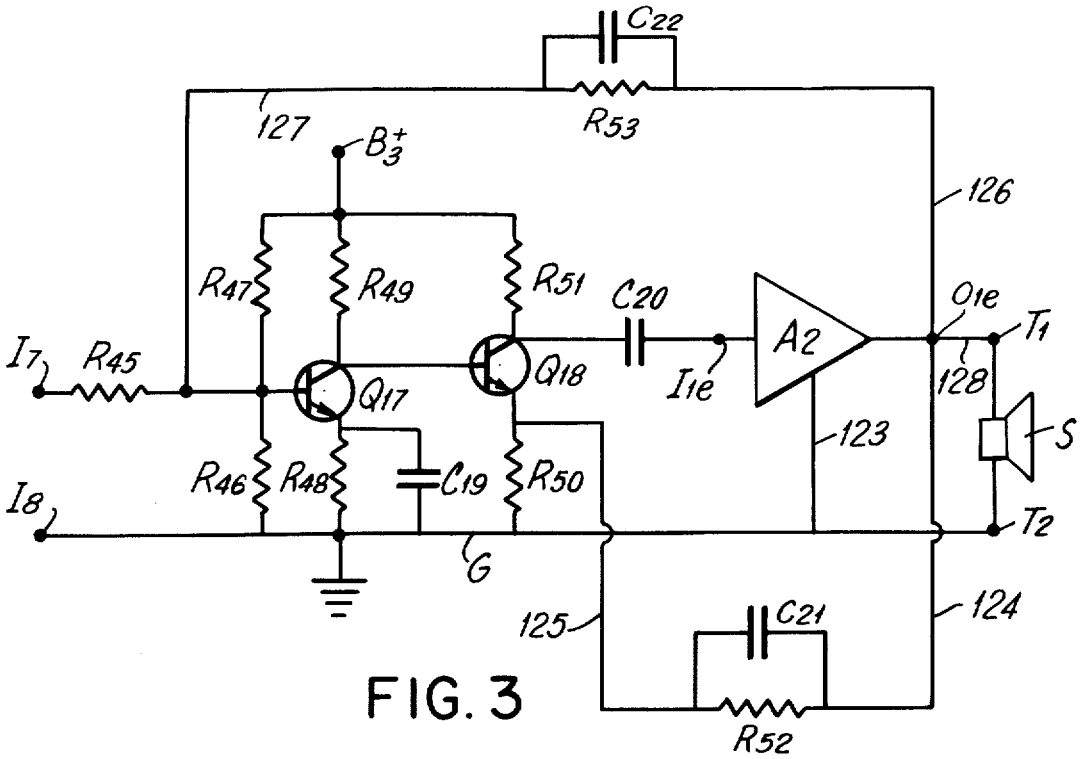
FIG. 3 is a schematic circuit diagram of a double-loop feedback system incorporating an amplifier in accordance with the present invention.
Figure 4:
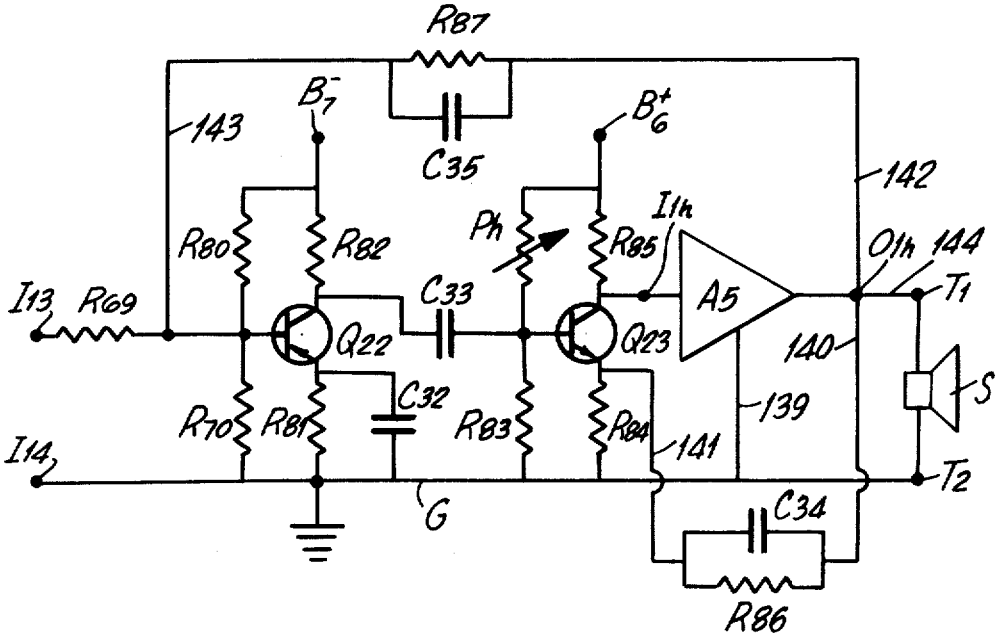
FIG. 4 shows another double-loop feedback system wherein the second preamplifier stage is D.C.-coupled to the amplifier.

Referring now to FIGS. 3 and 4, there are disclosed two embodiments of a double-loop feedback arrangement made more feasible by the improved phase shift characteristics due to the D.C.-coupling feature of the amplifier circuits shown in FIGS. 1 and 2. Each of these feedback systems comprises an inner negative feedback network extending around the final several stages, and providing, in addition to the usual feedback advantages of reduced distortion, an improved pole-zero configuration for this portion of the amplifier circuit so as to permit the application of still more feedback through the outer negative feedback network. That is, the inner feedback loop provides an added stability margin for the outer feedback loop.

Referring now to FIG. 3 in more detail, the reference character A2 designates a symbol for an amplifier which may be in accordance with the circuit of FIG. 1. The circuit of FIG. 2 may also be utilized provided that one of the preamplifier stages be omitted to take into account the extra phase inversion provided by the extra common-emitter pre-drive stage in this amplifier embodiment, as will be explained below.

The double-feedback system of FIG. 3 further comprises a first preamplifier stage operating in the Class A common-emitter mode and comprising a transistor Q17 having its base connected by resistor R45 to the input terminal 17. Resistor R45 prevents the feedback current from flowing into the preceding stage (not shown) instead of into the base of Q17. The other input terminal I8 is connected to ground bus G. Also connected to the latter are a base bias resistor R46 and an emitter resistor R48. The latter is bypassed by a capacitor C19. The other base bias resistor R47 extends to a potential source $B_3$+. Extending from the latter to the collector of transistor Q17 is a load resistor R49.

The collector of transistor Q17 is direct-coupled to the base of a transistor Q18 constituting a second preamplifier stage and having a collector load resistor R51 connected to the potential source $B_3$+ and an emitter resistor R50 connected to ground bus G. The collector of transistor Q18 is coupled by capacitor C20 to the input terminal 11e of amplifier A2.

Said amplifier input terminal 11e may correspond to terminal I1 of FIG. 1. Amplifier A2 is shown grounded to bus G by lead 123. The output terminal O1e of amplifier A2 is direct-coupled to speaker terminal T1 of loudspeaker S by lead 128. Output terminal O1e may correspond to output terminal O1 of FIG. 1. The other speaker terminal T2 is grounded to bus G.

The inner feedback network comprises a feedback resistor R52 in parallel with a capacitor C21 and connected by lead 124 to the output terminal 01e and by lead 125 to the emitter of preamplifier transistor Q18. The outer feedback network comprises a feedback resistor R53 in parallel with a capacitor C22 and connected by lead 126 to output terminal 01e and by lead 127 to the base of the first preamplifier transistor Q17.

The transistor and network parameters may be selected so as to provide either of two general modes of operation. Either the closed-loop transfer function of that portion of the circuit enclosed by the inner feedback network, hereinafter referred to as the "inner transfer function," has a substantially higher cutoff frequency than that of a preceding preamplifier stage, or said inner transfer function has a substantially lower cutoff frequency than all of the preceding preamplifier stages.

In the first mode of operation, capacitor C21 provides a phase-advance to improve the pole-zero configuration of the inner transfer function. The inner feedback network raises the high-frequency cutoff of this portion of the circuit by approximately the amount of the inner feedback. Transistor Q17 should be of a type having a beta cutoff freqency substantially lower than the cutoff frequency to which the inner transfer function is boosted by the inner feedback network. Alternatively, this roll-off in the first preamplifier stage may be provided by a filter network such as a resistor and a capacitor connected in series between the collector of Q17 and ground.

Therefore, as the signal frequency is increased, attenuation will occur initially only in the first preamplifier stage comprising transistor Q17, and the remaining stages enclosed by the inner feedback network will have neither frequency response attenuation nor phase shift to any significant degree until the signal frequency is increased to about a decade beyond the beta cutoff frequency of transistor Q17. By this time, transistor Q17 has provided sufficient attenuation so that the outer loop gain is reduced to below unity before the phase shift of the inner transfer function reaches 90°. Since the maximum phase shift in the first preamplifier stage is 90°, the overall loop gain will be reduced to below unity before the outer loop phase shift reaches 180°, and hence stability for the outer feedback loop is assured by the increased high frequency response of the inner transfer function provided by the inner feedback network.

The alternative mode of operation requires that the upper cutoff frequencies of all preceding preamplifier stages be subtantially greater than that of the inner transfer function. In the circuit of FIG. 3 this condition is satisfied by providing an early frequency rolloff in at least one of the stages of amplifier A2 and by selecting for Q17 a transistor having a very high beta cutoff frequency. In this event the inner transfer function provides sufficient attenuation so that the outer loop gain is reduced to below unity before the phase shift of Q17 reaches 90°, and hence before the outer loop phase shift reaches 180°.

Still another form of double-loop feedback system is shown in FIG. 4 wherein the second preamplifier stage is direct-coupled to the amplifier and the first preamplifier stage is capacitor-coupled to the second preamplifier stage, so as to be the reverse of the coupling arrangement of FIG. 3. More specifically, a first preamplifier transistor Q22 is provided with base bias resistors R70, R80, an emitter resistor R81 bypassed by a capacitor C32, and a collector resistor R82 connected to a potential source $B_7-$. The base of Q22 is connected to input terminal I13 by resistor R69 and the other input terminal I14 is grounded to bus G.

The collector of transistor Q22 is coupled by a capacitor C33 to the base of a second preamplifier transistor Q23 having an emitter resistor R84 and a base bias resistor R83 connected to ground bus G and a collector load resistor R85 and a base bias resistor in the form of potentiometer Ph conected to a potential source $B_6+$. The latter is preferably the junction of the positive end of zener diode Z1 of FIG. 1 and resistor R6 in the event that the amplifier A5 of FIG. 4 is in the form of said FIG. 1.

This circuit will be modified so as to eliminate therefrom the base bias network of the pre-drive stage including components D1, R1, R2 and P of FIG. 1. This bias network is omitted because the collector of transistor Q23 is direct-coupled to the base of the pre-drive stage transistor so as to set the bias of said base. The D.C. potential of output terminal O1h of amplifier A5 if set to ground level by adjustment of potentiometer Ph. Amplifier A5 is grounded to bus G by lead 139. Terminal T1 of loudspeaker S is direct-coupled to output terminal O1h by lead 144 and the other speaker terminal T2 is grounded.

The inner feedback network comprises a resistor R86 in parallel with a capacitor C34 and having one end connected by lead 140 to output terminal O1h and its other end connected by lead 141 to the emitter of transistor Q23. Because of the D.C.-coupling between transistor Q23 and amplifier A5, the inner feedback network of FIG. 4 serves two functions. In addition to the function of the inner feedback network of FIG. 3 as described above in connection with the latter, the inner feedback network of FIG. 4 also provides D.C. negative feedback which helps to maintain the D.C. potential of output terminal O1h at ground level so as to prevent direct current in the loudspeaker voice-coil. The outer feedback network is similar to that of FIG. 3 and comprises a resistor R87 in parallel with a phase-advance capacitor C35 and connected at one end to output terminal O1h by lead 142 and the other to the base of transistor Q22 by lead 143.

Figure 5:
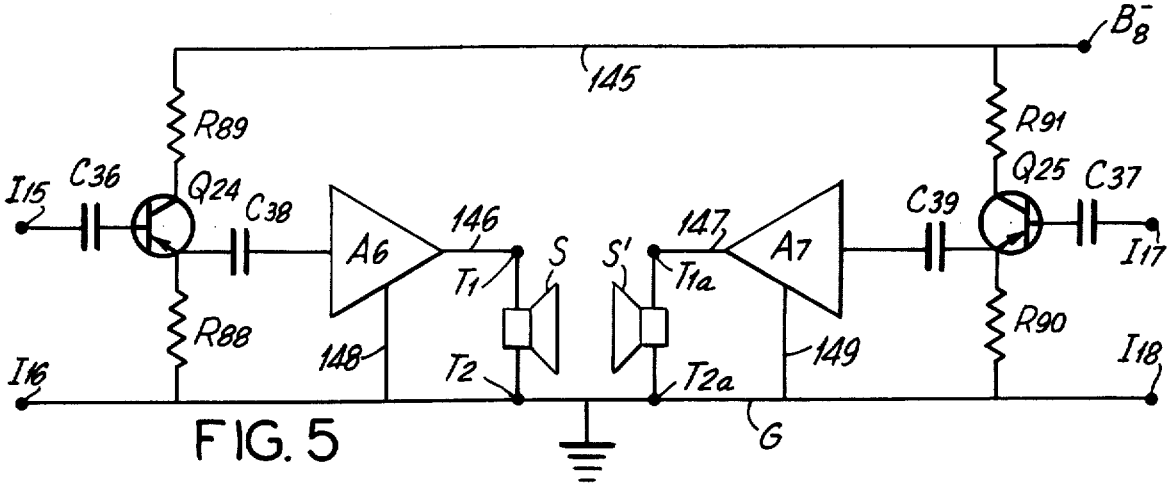
FIG. 5 shows two amplifiers each in accordance with the present invention and connected in a stereo mode so as to constitute two independent channels.
Figure 6:
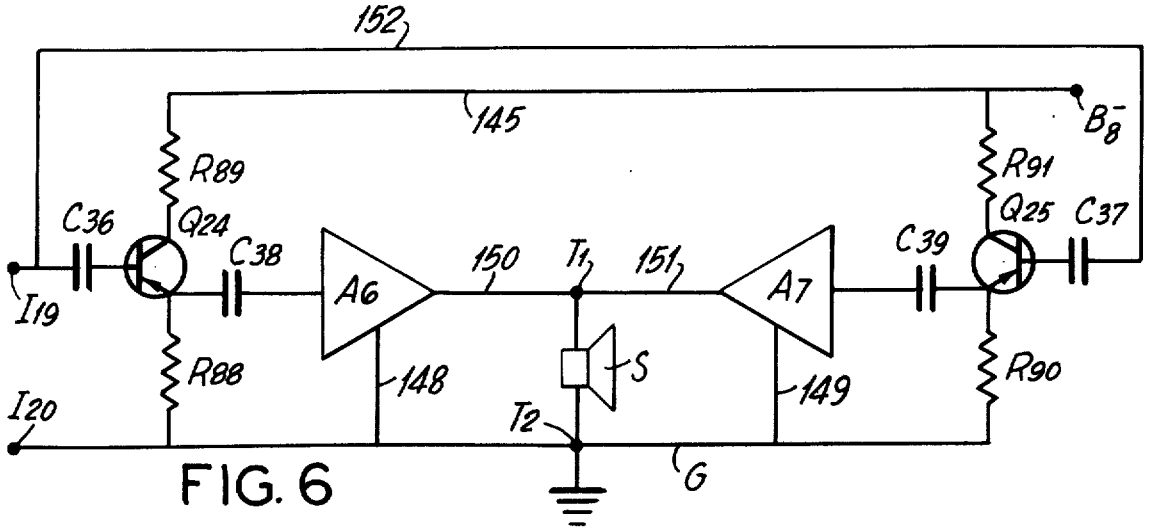
FIG. 6 shows the same two amplifiers connected in a parallel mode so as to match the relatively low impedance of a single four-ohm loudspeaker.
Figure 7:
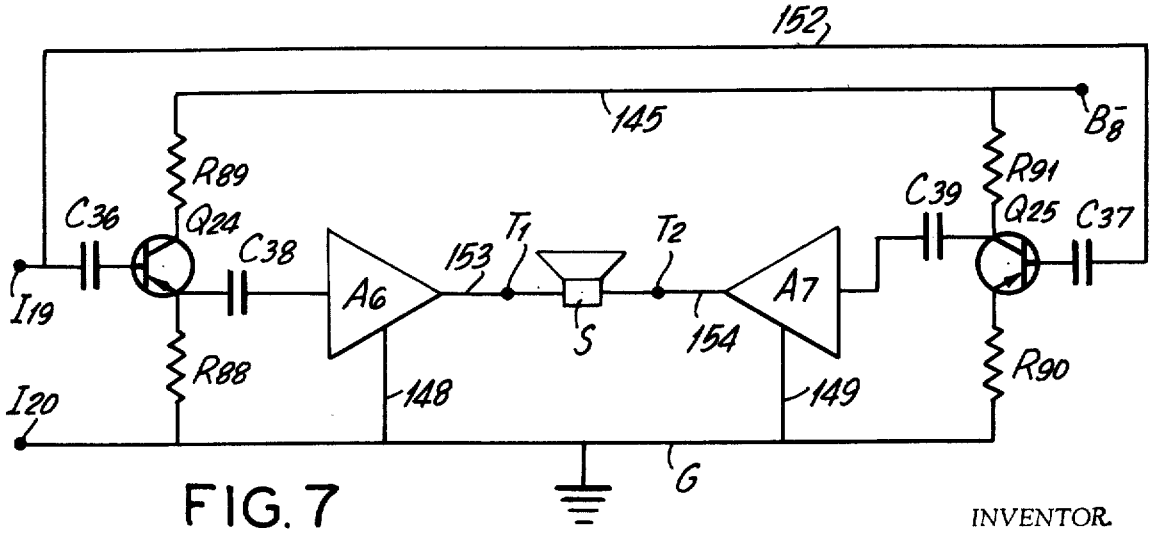
FIG. 7 shows the same two amplifiers connected in a series mode to form a full-bridge circuit for driving a single loudspeaker of high impedance such as sixteen ohms.

Referring now to FIGS. 5 to 7, there is shown the manner in which two amplifiers in accordance with the present invention may be connected alternatively in either a stereo mode (FIG. 5) to provide two independent channels, or in a parallel mode (FIG. 6) to drive a single low-impedance speaker, or in a series mode (FIG. 7) to drive a single high-impedance speaker. This alternative connection capability is made feasible by the fact that the present invention maintains the D.C. potential of the amplifier output terminals at a constant ground level.

Describing in more detail first the stereo mode connection of FIG. 5, amplifiers A6 and A7 may be identical and may embody any of the amplifier circuits described above. Each amplifier is preceded by a preamplifier stage comprising a transistor Q24 and Q25, respectively. Each of the latter is provided with an emitter resistor R88 and R90 and a collector resistor R89 and R91, respectively. Resistor R91 is connected to a potential source $B_8-$ and resistor R89 is connected to the latter by lead 145. The base of Q24 is coupled by capacitor C36 to the input terminal I15 and the base of Q25 is similarly coupled by capacitor C37 to the input terminal I17. The two input terminals I16 and I18 are grounded to bus G. The emitter of Q24 is coupled by capacitor C38 to the input of amplifier A6 and the emitter of Q25 is coupled by capacitor C39 to the input of amplifier A7. Amplifier A6 is grounded to bus G by lead 148 and amplifier A7 is similarly grounded by lead 149.

The reference letters S and S' indicate respectively the loudspeakers for the left and right channels. The terminal T1 of loudspeaker S is direct-coupled by lead 146 to the output of amplifier A6 and the terminal T1a of loudspeaker S' is direct-coupled by lead 147 to the output of amplifier A7. The other speaker terminals T2 and T2a are grounded to bus G. It will thus be seen that in the connection arrangement of FIG. 5 transistors Q24 and Q25 operate in the emitter-follower mode and that there are two independent channels each driving a respective one of the loudspeakers S, S'.

Describing now the parallel connection of FIG. 6, the same components as in FIG. 5 are employed but are connected in a different mode by a switching arrangement which is not shown since it would be obvious to one skilled in the art view of the disclosed circuit diagram. Input terminal I19 is coupled both to the base of Q24 by capacitor C36 and to the base of Q25 by lead 152 and capacitor C37. The other input terminal I20 is grounded.

The terminal T1 of a single loudspeaker S is direct-coupled both to the output of amplifier A6 by lead 150 and also to the output of amplifier A7 by lead 151. The other speaker terminal T2 is grounded. It will thus be seen that the amplifiers A6, A7 are driven in phase from a single pair of input terminals and are D.C.-coupled in parallel to each other and to the loudspeaker S.

Describing now the series connection of FIG. 7, the latter differs from that of FIG. 6 in only two respects. First, the loudspeaker S has one terminal T1 direct-coupled by lead 153 to the output of amplifier A6 and its other terminal T2 direct-coupled by lead 154 to the output of amplifier A7. Second, the input of amplifier is coupled by capacitor C39 to the collector of transistor Q25, instead of to the emitter of the latter as in FIG. 6. The second change provides a phase reversal in transistor Q25 so that the amplifiers A6 and A7 are driven in phase opposition to form a push-pull full-bridge output circuit for driving loudspeaker S.

Since amplifiers A6, A7 are connected in parallel in the connection of FIG. 6, each amplifier will "see" a load impedance of twice the impedance of loudspeaker S. Hence if the latter is of relatively low impedance, such as, for example, four ohms, each amplifier will have an effective load of eight ohms which is a better match for most power transistors. However, in the connection of FIG. 7 amplifiers A6, A7 are connected in series across the load, and hence each amplifier will have an effective load impedance of one-half the impedance of loudspeaker S. Therefore if the latter is of the high impedance type, such as sixteen ohms, each amplifier will have the better matched effective load of eight ohms.

It will thus be seen that the consumer has his choice of either two low-power stereo channels, or a single high-power monophonic amplifier with an impedance-matching capability for increased power output. This modular arrangement enables the consumer to start his stereo system at a minimum expense by purchasing a pair of channels and utilizing the stereo mode connection, and then to increase the power capability of the system by purchasing another pair of channels and utilizing each pair in either the parallel or series mode as may be suitable for the speaker impedances. In this way the system is improved without sacrificing the equipment originally purchased from consideration of modest initial cost.

Figure 8:
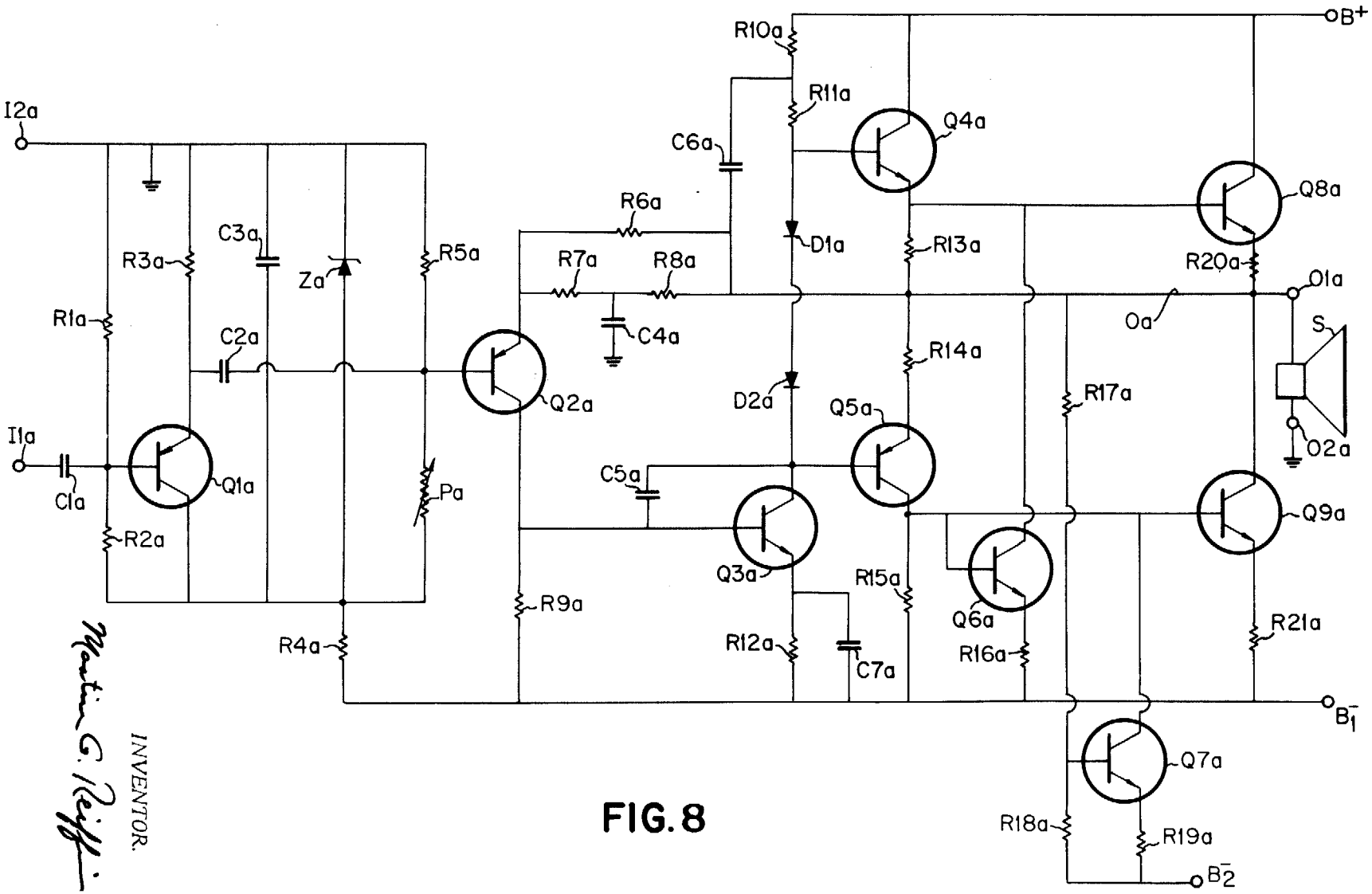
FIG. 8 shows a modified form of the invention wherein a zener diode provides a source of reference potential for the base of the first common-emitter stage.

Referring now to FIG. 8, the circuit embodiment there disclosed comprises an emitter-follower input stage including an NPN transistor Q1a having its base coupled through capacitor C1a to the hot input terminal I1a. The other input terminal 12a is grounded as shown. The emitter of transistor Q1a is provided with a load resistor R3a extending to ground.

There is provided a fixed regulated potential source at the negative electrode of a zener diode Za having its positive electrode connected to ground A. A resistor R4a extends from the negative terminal $B_1-$ of a conventional non-regulated power supply (not shown) to the negative electrode of zener diode Za. In order to filter out any residual ripple, a capacitor C3a may be connected in parallel across zener diode Za. The base of transistor Q1a is biased by connection to the junction of a pair of resistors R1a, R2a connected in series beween the negative electrode of zener diode Za and ground. The collector of transistor Q1a may also be connected to said negative electrode of zener diode Za.

The second stage including PNP transistor Q2a is the first of the two common-emitter stages. The base of transistor Q2a is coupled by capacitor C2a to the emitter of transistor Q1a and is biased by connection to the junction of the series-connected pair of resistors R5a and Pa, the latter preferably being variable in the form of a potentiometer for adjustment of the quiescent direct-current level of the output stage in a manner to be described. The negative end of potentiometer Pa is connected to the junction of resistor R4a and zener diode Za, and the positive end of resistor R5a is connected to ground. A collector load resistor R9a extends from the collector of transistor Q2a to the negative supply terminal $B_1-$.

The second common-emitter stage comprises an NPN transistor Q3a having its base direct-current coupled to the collector of the first common-emitter transistor Q2a. The emitter of transistor Q3a is connected through bias resistor R12a to A.C. ground at the negative supply terminal $B_1-$ and a conventional bypass capacitor C7a is connected in parallel across resistor R12a. The collector load impedance of transistor Q3a comprises the series connection of resistors R10a, R11a and temperature-compensating bias diodes D1a, D2a. The upper end of resistor R10a is connected to the positive power supply terminal B+ and the lower end of diode D2a is connected to the collector of transistor Q3a. If warranted by the phase-shift characteristics of the amplifier, a capacitor C5a may be connected between the collector and base of transistor Q3a to improve the feedback stability margin at high frequencies. A conventional bootstrapping capacitor C6a extends from output bus Oa to the junction of resistors R10a, R11a.

Connected in series between the emitter of transistor Q2a and the output bus Oa are a pair of resistors R7a, R8a. The junction of the latter is grounded with respect to alternating-current signals by a capacitor C4a. A resistor R6a is connected at one end to the output bus Oa and at the other end to the emitter of transistor Q2a. Resistors R7a, R8a thus provide direct-current feedback from the output to the emitter of transistor Q2a to maintain the quiescent direct-current potential of output terminal O1a at ground level and thereby obviate any substantial direct-current through the voice-coil of speaker S. At signal frequencies alternating current feedback is provided by resistors R6a, R7a.

Transistors Q2a and Q3a are of opposite polarity types, the former being shown for purposes of illustration as of type PNP whereas the latter is shown as type NPN. This enables the base of transistor Q3a to be direct-current-coupled to the collector of transistor Q2a while the emitter of the latter may be direct-current-coupled through the feedback network R7a, R8a to the output O1a of the amplifier.

The drive stage comprises a pair of complementary transistors Q4a and Q5a, the former being shown as type NPN and the latter as type PNP. The collector of transistor Q4a is connected to the positive power supply terminal B+ and its emitter is connected through bias resistor R13a to output bus Oa. The emitter of transistor Q5a is connected to output bus Oa by resistor R14a and its collector is connected by bias resistor R15a to the negative terminal $B_1-$. The base of transistor Q4a is direct-current-coupled to the junction of resistor R11a and diode D1a, and the base of transistor Q5a is direct-current-coupled to the collector of transistor Q3a. Drive transistors Q4a, Q5a operate in a push-pull mode and are preferably biased for Class AB operation in the usual manner.

The output stage comprises a pair of output transistors Q8a and Q9a connected in series between the positive power supply terminal B+ and the negative terminal $B_1-$, in the conventional single-ended push-pull configuration. The collector of transistor Q8a is connected to the positive supply terminal B+ and its emitter is connected through resistor R20a to the output bus Oa. Also connected to the latter is the collector of transitor Q9a having its emitter connected through resistor R21a to the negative supply terminal $B_1-$. The base of transistor Q8a is direct-current-coupled to the emitter of NPN drive transistor Q4a and the base of output transistor Q9a is similarly direct-current-coupled to the collector of PNP drive transistor Q5a. The resulting combination of drive stage Q4a, Q5a and output stage Q8a, Q9a constitutes the well-known quasi-complementary-symmetry arrangement.

A load, such as illustrated by loudspeaker S, is direct-coupled between the hot output terminal O1a and the grounded output terminal O2a. It will thus be seen that if the quiescent direct-current potential of output terminal O1a departs substantially from ground level a direct current will flow through the voice-coil of speaker S. This current will bias the cone of speaker S to an off-center position so as to increase the harmonic and intermodulation distortion characteristics of the speaker. Therefore it is important that the quiescent direct-current potential of output terminal O1a be maintained substantially at ground level.

This is achieved by a large amount of direct-current feedback from the output terminal O1a through the feedback network R7a, R8a to the emitter of transistor Q2a which is made possible by the existence of two stages of gain within the feedback loop; that is, the overall forward transmission gain is equal to the product of the individual voltage gains of the two common-emitter stages Q2a and Q3a. This large amount of direct-current feedback does not affect the stability characteristics at signal frequencies because at such frequencies the direct-current feedback is bypassed to ground by capacitor C4a and the amount of alternating-current feedback may be selected as desired by choosing the proper magnitude ratio of resistor R6a to resistor R7a.

Due to economic considerations, the respective potentials at power supply terminals B+ and $B_1-$ are unregulated, so as to undergo a substantial voltage drop and to contain a high ripple content when substantial power is drawn from the supply. Injection of the power supply ripple into the first two stages Q1a, Q2a is prevented by the bias network including zener diode Za, thereby avoiding the amplification of the ripple and maintaining a low hum level at the output of the amplifier.

Zener diode Za also maintains the base of transistor Q2a at a relatively fixed direct-current potential independent of variations in the power supply voltage due to regulation under load or voltage variations in the supply mains. This is important because the direct-current feedback network is arranged so that the potential at output terminal O1a is compared with that at the base of transistor Q2a which is therefore the reference potential. The feedback network corrects for any deviation of the potential of output terminal O1a from this reference potential and if the latter is substantially fixed the potential of output terminal O1a may be maintained at the proper ground level so as to prevent quiescent direct-current through the voice-coil of speaker S.

Another advantage of the circuit of FIG. 8 is that the distortion may be reduced to extremely small levels by the application of a large amount of alternating-current feedback without the usual problems of oscillation and poor transient response to an inadequate stability margin. With respect to low frequencies, unstable operation such as "motor boating," blocking bias changes, and other symptoms of instability cannot occur because the circuit has no low-frequency phase-shift-producing coupling capacitors within the feedback loop.

With respect to high frequencies, the circuit arrangement provides stability by causing the second common-emitter transistor Q3a to roll off at a much lower frequency than the other stages so that the overall amplifier gain is reduced to unity before the total phase shift reaches 180°. This is achieved by driving transistor Q3a from a relatively high-impedance source provided by the preceding first common-emitter stage Q2a. The impedance of the driving source is substantially the value of resistor R9a which is preferably about several thousand ohms. Hence the second common-emitter stage Q3a will roll off substantially at the beta cutoff frequency. On the other hand, the first common-emitter stage Q2a is driven by the relatively low-impedance source provided by the preceding emitter-follower transistor Q1a. Hence transistor Q2a has an effective high-frequency cutoff substantially beyond the beta cutoff frequency. The drive-output stage configuration comprising transistors Q4a, Q5a and Q8a, Q9a also operates in the emitter-follower mode, so that the voltage response of this configuration may also extend far beyond the beta cutoff frequency of the second-common-emitter stage Q3a. *The above-described combination of low source impedance for the first common-emitter stage and high source impedance for the second common-emitter stage serves to enhance the inherent mode of operation of the disclosed cascade arrangement of two successive common-emitter stages followed by an emitter-follower stage. That is, the first common-emitter stage has a relatively high roll-off frequency because it is loaded by the inherently low input impedance of the second common-emitter stage, and the second common-emitter stage has a relatively low roll-off frequency because it is loaded by the inherently high input impedance of the emitter-follower operation of the drive-output stages.*

*This mode of operation is also inherent in the other disclosed embodiments comprising the cascade arrangement of two successive common-emitter stages followed by an emitter-follower drive-output configuration. However, the circuits of FIGS. 2, 4, 8 and 9 are particularly*

*advantageous in that this mode of operation is achieved along with the important capability of using output transistors of the same polarity type.* As a result, alternating-current feedback resistors R6a, R7a may be selected so as to apply an unusually large amount of feedback without causing oscillation, transient ringing, or other symptoms of insufficient stability margin at the high-frequency end of the spectrum.

It will be seen that when drive transistor Q4a is cut-off, no current flows through bias resistor R13a and hence the base of output transistor Q8a is at the same potential as output bus Oa. Hence in the absence of the circuitry to be described below the base and emitter of transistor Q8a would be substantially at the same potential and no reverse bias would be applied to the base-emitter junction of output transistor Q8a during its "off" half of the cycle. Similarly, when drive transistor Q5a is cutoff, no current flows through bias resistor R15a and hence the base and emitter of output transistor Q9a would be substantially at the same potential so that no reverse bias would be applied to the base-emitter junction of transistor Q9a during its "off" portion of the cycle.

As a result, at high frequencies excess minority carriers would remain stored in the respective bases of output transistors Q8a, Q9a during their "off" portions of the cycle in the absence of any reverse bias to drain off the trapped majority carriers which keep an equal number of minority carriers in the base in accordance with the requirement for space-charge neutrality. A substantial collector current would thereby flow through each output transistor Q8a, Q9a when it should be cutoff, at which time the transistor is subjected to a relatively high collector voltage. This would cause excessive heat dissipation and destruction of output transistors Q8a, Q9a when subjected to a continuous high-level signal at a high audio frequency.

To obviate this problem, the circuit of FIG. 8 is provided with a pair of transistors Q8a and Q7a which function to provide a reverse bias at the respective base-emitter junctions of output transistors Q8a, Q9a during their respective "off" portions of the push-pull cycle. The collector of transistor Q6a is connected to the base of output transistor Q8a and the base of transistor Q6a is connected to the collector of driver transistor Q5a. The emitter of transistor Q6a is connected through bias resistor R16a to the negative supply terminal $B_1$−. The collector of transistor Q7a is connected to the base of transistor Q9a. The base of transistor Q7a is connected through resistor R17a to the output bus Oa and also through resistor R18a to an auxiliary negative supply terminal $B_2$−. Also connected to the latter through a bias resistor R19a is the emitter of transistor Q7a.

During the "off" phase of output transistor Q8a, a substantial current is drawn through bias resistor R15a by drive transistor Q5a so as to raise the potential at the base of transistor Q6a thereby turning the latter "on" to draw current from output bus Oa through resistor R13a to the collector of transistor Q6a. As a result the potential at the base of output transistor Q8a will be below that of output bus Oa by the amount of the potential drop through resistor R13a, thereby reverse-biasing the base-emitter junction of output transistor Q8a. Similarly, during the "off" phase of output transistor Q9a the potential of output bus Oa rises so as to raise the potential at the base of transistor O7a thereby turning the latter "on" so as to draw current from the negative supply terminal $B_1$− through the bias resistor R15a to the collector of transistor Q7a thereby reverse-biasing the base-emitter junction of transistor Q9a by approximately the amount of the voltage drop in resistor R15a.

Figure 9:
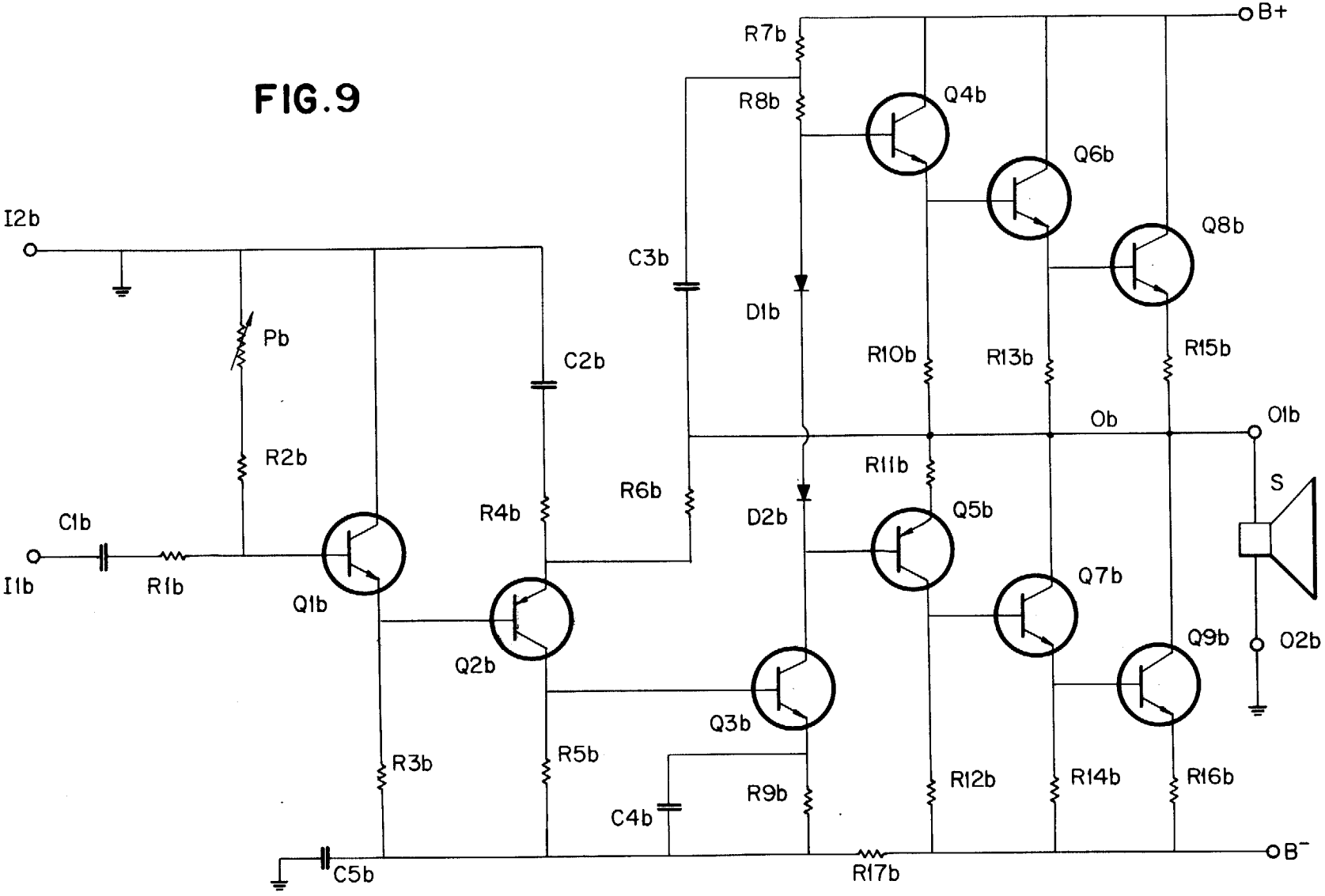
FIG. 9 shows another modified form of the invention wherein the ground is a source of reference potential and an emitter-follower stage maintains the base of the first common-emitter stage at a fixed quiescent potential.

Referring now to FIG. 9, there is shown a modified form of the invention wherein the base of the first common-emitter stage is biased by direct coupling to the emitter of a preceding emitter-follower stage. The input terminal I1b is coupled by a capacitor C1b and a resistor R1b to the base of an NPN transistor Q1b operating in the emitter-follower mode. The base of transistor O1b is biased by a variable resistance in the form of a potentiometer Pb connected at one end to ground and at the other end in series with a resistor R2b extending to said base. The other input terminal I2b is grounded as shown. The collector of transistor Q1b is connected to ground and its emitter is connected through emitter load resistor R3b and filter resistor R17b to the negative supply terminal B− of a conventional non-regulated power supply (not shown). A capacitor C5b extends from the junction of resistors R3b, R17b to ground to bypass the ripple at supply terminal B−.

The emitter of transistor Q1b is direct-coupled to the base of a PNP transisor Q2b constituting the first common-emitter stage. The emitter of transistor Q2b is connected through the series combination of resistor R4b and capacitor C2b to ground, and its collector is connected to the filtered negative supply through the load resistor R5b. The collector of transistor Q2b is direct-coupled to the base of an NPN transistor Q3b constituting the second common-emitter stage and having its emitter connected to the filtered negative supply through bias resistor R9b in parallel with bypass capacitor C4b. The collector load impedance of transistor Q3b comprises a series network including load resistors R7b, R8b and temperature-compensating diodes D1b, D2b extending from the positive supply terminal B+ to said collector. A conventional bootstrapping capacitor C3b has one end connected to the output bus Ob extending from the hot output terminal O1b and its other end connected to the junction of resistors R7b, R8b.

It will be noted that each transistor of the cascade arrangement Q1b, Q2b, Qb3 is of complementary polarity type with respect to the preceding transistor. For purposes of illustration, transistors Q1b and Q3b are shown to be of NPN type whereas transistor Q2b is illustrated as of PNP type. However, it will be understood that these polarity types may be reversed if desired. As a result of this arrangement direct-coupling between these stages with maintenance of proper bias conditions can be obtained without the use of Zener diodes, regulated power supplies and similar expedients.

The drive stage comprises a pair of complementary transistors Q4b and Q5b, for purposes of illustration the former being of NPN type and the latter of PNP type. The collector of transistor Q4b is connected to the positive supply terminal B+ and its emitter is connected through bias resistor R10b to output bus Ob. Also connected to the latter through resistor R11b is the emitter of transistor O5b having its collector connected through bias resistor R12b to the negative supply terminal B−. The base of drive transistor Q4b is direct-coupled to the junction of resistor Q8b and diode D1b, and the base of drive transistor Q5b is similarly direct-coupled to the junction of diode D2b and the collector of transistor Q3b.

The next stage has a novel function and will be referred to by the coined term "quasi-output" stage. It comprises a pair of transistors Q6b, Q7b of the same polarity type. The collector of transistor Q6b is connected to the positive supply terminal B+ and its emitter is connected to output bus Qb through resistor R13b. Also connected to output bus Ob is the collector of transistor Q7b having its emitter connected through resistor R14b to the negative supply terminal B−. The base of quasi-output transistor Q6b is direct-coupled to the emitter of drive transistor Q4b and the base of the other quasi-output transistor Q7b is similarly direct-coupled to the collector of drive transistor Q5b.

The output stage comprises a pair of transistors Q8b, Q9b of the same polarity type. The collector of transistor Q8b is connected to the positive supply terminal B+ and its emitter is connected through resistor R15b to output bus Ob. Also connected to the latter is the collector of output transistor Q9b having its emitter connected through bias resistor R16b to the negative supply terminal B−. The base of output transistor Q8b is direct-coupled to the emitter of quasi-output transistor Q6b and the base of output transistor Q9b is direct-coupled to the emitter of quasi-output transistor Q7b.

The reference letter S indicates a loudspeaker or other load having one end connected to the hot output terminal O1b and its other end connected to the second output terminal O2b which may be grounded as shown. In order to prevent the flow of quiescent direct-current through the voice-coil of speaker S, the quiescent potential of output terminal O1b must be maintained substantially at ground level. The bias conditions of the various stages may be initially set so as to adjust the potential output terminal O1b to ground level by varying potentiometer Pb.

Since the base of transistor Q1b is connected to ground through resistor R2b and potentiometer Pb, the base of transistor Q1b is maintained at a substantially fixed potential with respect to ground. Because transistor Q1b operates in the emitter-follower mode, its emitter will be maintained at a substantially constant predetermined potential difference from that of its base independently of any potential variation and ripple component at the negative power supply terminal B−. As a result the base of the first common-emitter transistor Q2b is maintained at a relatively fixed reference potential.

The potential at the emitter of transistor Q2b is constantly compared with this fixed reference potential at its base by means of the direct-current feedback network comprising feedback resistor R6b extending from output bus Ob to the emitter of transistor Q2b. For example, if the potential of output bus Ob tends to rise above ground level the resulting increased voltage across the base-emitter junction of transistor Q2b causes more collector current to flow therethrough thereby increasing the voltage drop across resistor R5b and increasing the potential at the collector of transistor Q2b. This in turn raises the potential at the base of transistor Q3b so as to increase the collector current therethrough and thereby increase the voltage drop across load resistors R7b, R8b. This lowers the potential at the collector of transistor Q3b. Since the remaining drive, quasi-output and output stages operate effectively in the emitter-follower mode, the lower potential of the collector of transistor Q3b in turn results in a lower potential of output bus Ob so as to counteract the originally assumed tendency of the potential of output bus Ob to rise. It will be obvious that the feedback arrangement has the opposite effect in the event that there is a tendency for the potential of output bus Ob to fall. The unity feedback provided by the resistor R6b is reduced at signal frequencies by capacitor C2b and resistor R4b. The relative magnitudes of resistors R4b, R6b are selected so as to attain the desired amount of alternating-current feedback.

The amount of this alternating-current feedback may be made extremely large so as to reduce the distortion of the amplifier to almost unmeasurable levels while retaining an ample stability margin which will obviate any tendency to oscillation, ringing, or transient distortion, as discussed above with respect to the circuit modification of FIG. 8. At the high frequency end the circuit of FIG. 9 provides an additional stability margin by virtue of the fact that the lower output transistor Q9b is driven by a source of much lower impedance than that which drives the lower output transistor Q9a in FIG. 8. That is, the magnitude of resistor R15a of FIG. 8 is preferably about one hundred ohms which is the source of impedance seen at the base of output transistor Q9a. This causes output transistor Q9a to roll-off at substantially its beta cutoff frequency. In the present state of the art, this beta cutoff frequency for output transistors of reasonable cost is approximately one octave below the upper audio limit, generally [ regard ] *regarded* as 20 kHz. The resulting phase shift in the circuit of FIG. 8 substantially reduces the stability margin at high frequencies.

In the circuit of FIG. 9, on the other hand, the lower output transistor Q9b is driven by a relatively low source impedance of only a few ohms. As will be explained below, the magnitude of resistor R14b is preferably in the range of about 2 to 10 ohms. Furthermore, the base of transistor Q9b is driven by the emitter of quasi-output transistor Q7b operating in the emitter-follower mode which provides a low source of impedance. As a result of the low impedance of the driving source seen by the base of output transistor Q9b the effective roll-off frequency of the latter extends far beyond the beta cutoff frequency of the transistor and the resulting reduction of phase shift improves the stability margin of the circuit of FIG. 9 as compared to that of FIG. 8.

In FIG. 9 the quasi-output stage Q6b, Q7b and output stage Q8b, Q9b function in the novel manner disclosed in my prior copending application entitled, "Transistor Audio Amplifier with Power-Division Output Stages," Ser. No. 501,515, filed Oct. 22, 1965. The quasi-output stage is normally biased with a small quiescent current for Class AB push-pull operation so as to supply power to the load S at low signal levels while at these levels the output stage Q8b, Q9b is entirely cutoff. The load current flows alternately through resistors R13b, R14b which are preferably in the range of about 2 to 10 ohms each. At higher signal levels the respective voltages across R13b, R14b attain a magnitude sufficient to turn on respective output transistors Q8b, Q9b so that the latter then become active and supply power to the load S at higher signal levels, at which time quasi-output transistors Q6b, Q7b function as drive transistors for the output stage Q8b, Q9b.

Since there is substantially no quiescent bias current in the output stage Q8b, Q9b even at higher operating junction temperatures, the problems of thermal runaway, excessive power dissipation and reduced power ratings are avoided. Because the low-level power is provided by the quasi-output stage Q6b, Q7b which is biased with a sufficiently large quiescent current for this purpose, crossover distortion at low levels is minimized. No problem of excessive bias current can arise in quasi-output stage Q6b, Q7b because this stage provides only small amounts of power and therefore operates at relatively cool junction temperatures so that the transfer characteristic of the transistors does not vary significantly. For further details as to the mode of operation and advantages of this drive-output arrangement reference is made to said prior copending application Ser. No. 501,515.

Alternatively, transistors Q6b, Q7b of FIG. 9 may function as a conventional emitter-follower drive stage and the output stage Q8b, Q9b may be provided with a small quiescent bias current so as to operate in the Class AB mode in the usual manner. In this event emitter resistors R13b, R14b are of a magnitude sufficient to bias output transistors Q8b, Q9b at this quiescent point, a typical magnitude for these resistors being about two hundred ohms. In this arrangement the lower output transistor Q9b will still be driven by a relatively low source impedance since transistor Q7b operates in an emitter-follower mode having a low output impedance. As a result the extended high-frequency response and reduced phase shift of transistor Q9b discussed above are retained.

In all of the embodiments disclosed in FIGS. 1 to 9 described above and in FIGS. 1a, 2a, 3a and 4a to be described below the critical importance of the drive stage for the practical utilization of the subject circuits in most applications, and the coaction of the drive stage with the direct-current coupling arrangement for this purpose, will not be apparent to those skilled in the art and are now described. Although providing obvious secondary advantages such as increased current gain and, in some embodiments, phase inversion, the primary need for the drive stage is to protect the loudspeaker from being damaged in the event of failure of an output transistor. This requirement arises because of the lack of an output coupling capacitor or output transformer to isolate the loudspeaker from the power supply in the event of a shorted output transistor. The drive stage is able to provide the required protection of the loudspeaker because of the direct-current transmission path through the amplifier. Furthermore, the protective effect is greatly enhanced by the direct-current feedback network, as explained in detail below.

The importance of this safety feature cannot be under-estimated. The expense and inconvenience of delivering a twenty-pound amplifier to a repair shop for replacement of a few transistors is far less than that involved in returning a one-hundred-pound speaker system to the factory for replacement of the voice-coil, cone and suspension. Furthermore, although the consumer has learned to accept the risk of transistor amplifier failure as inherent in the price he must pay for its advantages over tube amplifiers, reputable manufacturers are understandably reluctant to market an amplifier which might also destroy the loudspeaker.

The operation of the subject protective arrangement will be described with respect to FIG. 1, it being understood that the same protective operation is provided by the other embodiments of FIGS. 2 to 4, 8 and 9 and that a substantially similar operation is provided by the embodiments of FIGS. 1a, 2a, 3a and 4a to be described below. Referring to FIG. 1, let it be assumed that output transistor Q5 undergoes a short-circuit failure due to second breakdown or other cause. In this event output terminal O1 will be connected practically directly to the negative terminal of the power supply B'1 since the magnitude of emitter resistor R12 is generally only about one-half ohm. Almost the entire voltage of power supply B'1 is thereby impressed across the voice-coil of loudspeaker S so that in the absence of some protective circuit arrangement a large surge of current will flow through the voice-coil so as to burn out the voice-coil or to cause mechanical damage to the voice-coil or the cone suspension when the cone "buttoms." The protective arrangement of the present invention prevents a large current surge through the voice-coil, in the following manner.

Since the bases of drive stage transistors Q2, Q3 are direct-current coupled by leads 11, 12 to the collector circuit of transistor Q1 said bases are maintained at the respective potentials determined by the signal applied to the input terminal I1 of the amplifier notwithstanding the short-circuit failure of output transistor Q5. The tendency of said bases to resist potential deviation due to output transistor failure is further enhanced by the direct-current feedback network comprising lead 16, potentiometer Pb and resistor R2 so as to apply to the base of transistor Q1 a feedback signal counteracting any tendency of the potentials of the drive stage bases to go negative. Therefore as the potential of output terminal O1 commences to go negative in response to the short-circuit failure of output transistor Q5 the emitter of drive transistor Q2 goes negative therewith to increase the forward-bias voltage across the base-emitter junction of drive transistor Q2. The latter thereby conducts a large collector current. The resulting large voltage drop across resistor R8 causes a large forward-bias across the base-emitter junction of lower output transistor Q4 to cause the latter to conduct a large collector current.

The currents thus conducted by transistors Q2 and Q4 flow from the positive terminal of power supply B1 through said transistors to output terminal O1, through emitter resistor R12, and then through the short-circuited output transistor Q5 to the negative terminal of power supply B'1. As a result a large portion of the short-circuit current flowing through output transistor Q5 is supplied by transistors Q2 and Q4 so as to be effectively bypassed around loudspeaker S instead of flowing therethrough. The voice-coil of loudspeaker S is thereby subjected to a substantially smaller surge of current so as to obviate the damage that would otherwise occur.

The usual drive transistor types employed will act as protective fuses by undergoing almost instantaneous second breakdown in response to breakdown of the output transistor in the opposite half of the push-pull arrangement. That is, instead of merely passing a large collector current, transistor Q2 will instantaneously fail and become a short-circuit thereby more effectively bypassing the short-circuit current around loudspeaker S and also serving to protect the lower output transistor Q4 to prevent the latter from undergoing breakdown.

If output transistor Q4 should break down and undergo a short-circuit failure, instead of output transistor Q5, then the other drive stage transistor Q3 will provide current bypass protection for loudspeaker S in a similar manner. The direct-current coupling to the base of transistor Q3 and the direct-current feedback network to the base of transistor Q1 tend to maintain the potential of the base of transistor Q3 against displacement as the emitter potential of transistor Q3 is drawn towards the positive potential of power supply B1 due to the short-circuit of output transistor Q4. The forward-bias voltage across the base-emitter junction of transistor Q3 is thereby increased and a large emitter current flows through transistor Q3 to drive output transistor Q5 heavily into the active region. A large portion of the short-circuit current flowing through transistor Q4 is thus supplied by transistors Q3 and Q5 so as to reduce substantially the surge of current through loudspeaker S. If drive transistor Q3 is of the type usually selected for this function it is likely to undergo almost instantaneous second breakdown so as to improve the efficacy of this protective arrangement.

It will be understood that drive transistors Q2 and Q3, although in a sense operate as fuses particularly when they undergo second breakdown, provide a protective function which could not be rendered even by the fastest acting instrument fuses available. It is well recognized that fuses are ineffective to protect the loudspeaker because the latter is usually damaged before the finite time required for the fuse to melt. However, the time required for drive transistors Q2 and Q3 to undergo second breakdown is so small as to result in practically instantaneous protection for the loudspeaker.

In the embodiments of FIGS. 1 to 4, 8 and 9 the protective function of the drive stage is achieved by conductively coupling the drive transistor emitters to the output terminal through bias resistors, whereas in the embodiments of FIGS. 1a, 2a, 3a and 4a the drive stage emitters are conductively coupled to the output terminal through the base-emitter junctions of the respective output transistors, as will be described below.

Figure 1A:
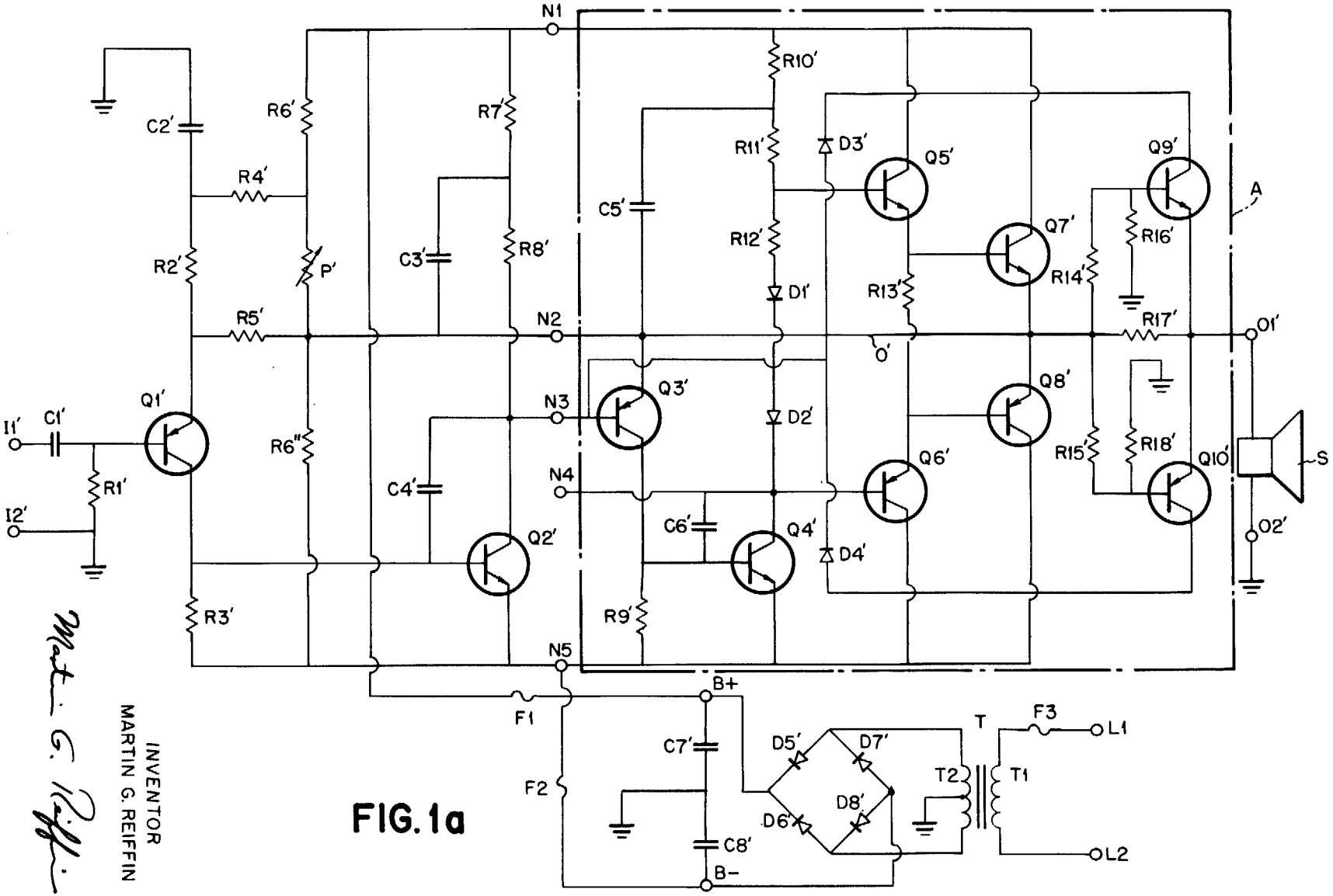
FIG. 1a shows still another modified form of the invention wherein the source of reference potential is at ground level.

Referring now to FIG. 1a there is disclosed another embodiment of the invention utilizing the same principles described above with respect to FIGS. 1 to 4. Input terminal I1′ is coupled by capacitor C1′ to the base of PNP transistor Q1′ operating Class A in the common-emitter mode. The other input terminal I2′ is grounded. In this embodiment the ground, instead of a zener diode, serves as a source of reference potential in that bias resistor R1′ extends from ground to the base of transistor Q1′ to maintain the base at a fixed quiescent reference potential substantially independent of power supply regulation and ripple, ambient and operating temperature variations, and other variables.

A resistor R2′ and capacitor C2′ are connected in series between the emitter of transistor Q1′ and ground. Also connected to the emitter of transistor Q1′ is one end of a resistor R5′ having its other end connected to output bus O′ of the amplifier. A fixed resistor R6′ and a variable resistor in the form of a potentiometer P′ are connected in series between the B+ power supply terminal and output bus O′. A resistor R6″ extends from output bus O′ to the negative terminal B− of the power supply. A resistor R4′ extends between the junction of resistor R6′ and potentiometer P′ and the junction of capacitor C2′ and resistor R2′.

The function of resistors R4′, R6′ and potentiometer P′ is to bias the emitter of transistor Q1′ at the quiescent potential which is positive with respect to ground. This is necessary because of the voltage drops across the base-emitter junction of transistor Q1′ and the bias resistor R1′. It will be obvious that if the quiescent potential of the base is displaced in a predetermined direction and magnitude with respect to ground, as compared with the above-described embodiments, then the quiescent potential of the emitter must be identically displaced in order to maintain the same bias voltage across the base-emitter junction of the transistor.

The second stage comprises an NPN transistor Q2′ operating Class A in the common-emitter mode and having its base direct-coupled to the collector of transistor Q1′, its emitter A.C.-coupled to ground through the negative supply terminal B−, and its collector connected to the lower end of a first load resistor R8′ having its upper end connected to a second load resistor R7′ in turn connected to the positive supply terminal B+. A capacitor C4′ may be provided between the collector and base of transistor Q2′ to provide a roll-off and phase shift at high frequencies so as to increase the stability margin of the amplifier. The usual bootstrapping capacitor C3′ extends from output bus O′ to the junction of load resistors R7′, R8′.

The third stage comprises a PNP transistor Q3′ having its base direct-coupled to the collector of transistor Q2′, its emitter conductively connected to output bus O′ and its collector connected through load resistor R9′ to the negative supply terminal B−. The connection of the emitter to output bus O′ provides so-called "unity-gain feedback" for a purpose to be described.

The fourth stage comprises an NPN transistor Q4′ operating Class A in the common-emitter mode and having its base direct-coupled to the collector of transistor Q3′, its emitter connected to the negative supply terminal B−, and its collector connected to the lower end of the usual temperature-compensating bias diodes W1′, W2′. Connected in series with the latter is a bias resistor R12′ and a pair of collector load resistors R10′, R11′. The upper end of resistor R10′ is connected to the positive supply terminal B+. Here again a phase shift capacitor C6′ may be provided between the collector and base of transistor Q4′ and the usual bootstrapping capacitor C5′ extends between output bus O′ and the junction of collector load resistors R10′, R11′.

The complementary push-pull drive stage comprises NPN transistor Q5′ and PNP transistor Q6′ having their emitters connected in series by a bias resistor R13′. The collector of transistor Q5′ is connected to the positive supply terminal B+ and the collector of transistor Q6′ is similarly connected to the negative supply terminal B−. The base of transistor Q5′ is direct-current coupled to the lower end of collector load resistor R11′ and the base of transistor Q6′ is direct-coupled to the collector of transistor Q4′.

The push-pull output stage, unlike that of the previous embodiments described above, is of the complementary type and comprises an NPN output transistor Q7′ and a PNP output transistor Q8′ having their emitters connected to output bus O′. The base of transistor output base Q7′ is direct-coupled to the emitter of drive transistor Q5′ and the base of output transistor Q8′ is similarly direct-coupled to the emitter of drive transistor Q6′. The drive transistor emitters are thus conductively connected to output bus O′ through the respective base-emitter junctions of output transistors Q7′, Q8′ so as to protect loudspeaker S from damage in the event of short-circuit failure of an output transistor.

For example, failure of output transistor Q7′ will cause the potential of output bus O′ to swing upwardly toward the potential of supply terminal B+ and will tend to pull the emitter of output transistor Q8′ upwardly therewith to impart a large forward-bias to the base-emitter junction of output transistor Q8'. The potentials of the base of transistor Q8' and the emitter of transistor Q6' are thereby also drawn upwardly whereas the potential of the base of drive transistor Q6' is maintained substantially fixed by the direct-current coupling thereto through the previous stages and by the direct-current feedback network. Therefore the base-emitter junction of drive transistor Q6' becomes heavily foward-biased to provide a large drive current to the base of output transistor Q8'. Both transistor Q6' and Q8' thus become highly conductive so as to provide a substantial portion of the short-circuit current flowing through output transistor Q7' and thereby substantially reducing the current surge through loudspeaker S. If drive transistor Q6' has the power capability of the types usually employed for this function it is likely to go into second breakdown and fail so as to serve as an almost instantly acting protective fuse as described above. Since the drive and output stages of this embodiment are symmetrical, it will be apparent that drive transistor Q5' functions in the same manner in the event that output transistor Q8' breaks down and becomes short-circuited.

Transistors Q9' and Q10' constitute a protective circuit to prevent output transistors Q7' and Q8' from undergoing second breakdown in the event of a short-circuit across output terminals O1', O2', or a [ lead ] *load* impedance which is either highly reactive or too low in magnitude, or any other condition which might cause the operating point of one of the output transistors to enter a region of high instantaneous current simultaneous with high instantaneous voltage. This might occur, for example, even with a normal speaker load if the amplifier is driven with a large low-frequency transient signal such as is generated when the tone arm is dropped upon the record or when switching between signal sources or when plugging and unplugging connector cables with the equipment energized. This protective circuit is substantially the same in principle and mode of operation to that first disclosed in said prior application Ser. No. 388,399 except for minor differences arising from the fact that in said prior application the current-sensing resistor was connected to the grounded output terminal whereas in the present embodiment it is connected to the hot output terminal.

This current-sensing resistor is designated R17' in FIG. 1a and is connected in series between output bus O' and the hot output terminal O1'. The respective emitters of transistors Q9', Q10' are connected to one end of resistor R17' and their respective bases are connected through resistors R14', R15' to the opposite end of resistor R17'. Said bases are also connected through resistors R16', R18' to ground. The collector of transistor Q9' is connected through diode D3' to the base of transistor Q3', and the collector of transistor Q10' is similarly connected to said base through diode D4'.

As originally described in said prior application Ser. No. 388,399 the protective circuit continuously senses both the instantaneous voltage and instantaneous current of the output transistors, and thereby monitors the instantaneous power dissipation of the output transistors. Should the operating point of either of the output transistors tend to enter a region of higher instantaneous power dissipation than that predetermined by the selected parameter values of the protective circuit, the latter will clip the drive signal from transistor Q2' to transistor Q3', in the following manner.

The load current passing through loudspeaker S from output stage Q7', Q8' must flow through resistor R17' so that the instantaneous voltage across the latter is directly proportional to the emitter current of the output transistor which is conducting at that instant. This current-responsive voltage is applied across the respective base-emitter junctions of transistors Q9', Q10' through resistors R14', R15' to foward-bias one junction and reverse-bias the other, depending upon the direction of current flow through resistor R17'. For example, if the direction is from output transistor Q7' to output terminal O1' then the base-emitter junction of transistor Q9' will tend to be forward-biased whereas that of transistor Q10' will tend to be reverse-biased.

Opposing this bias is a signal applied to the respective bases of transistors Q9', Q10' and which is proportional to the voltage swing of the midpoint of the output stage at the junction of the emitters of transistors Q7', Q8'. For example, assuming that output transistor Q7' is conductive, the potential of the output stage midpoint will go positive. Since resistor R17' is preferably in the range of about one-half ohm the potential of output terminal O1' will closely follow the rising potential at the midpoint of the output stage so as to raise the potential at the emitter of transistor Q9'. However the base of transistor Q9' does not rise in potential to the same extent because of the connection to ground through resistor R16' and hence the rise in potential at output terminal O1' will tend to maintain transistor Q9' cutoff. Transistor Q9' will then have no effect upon the signal transmitted by transistor Q4' to drive stage Q5', Q6'.

However, let it now be assumed that output terminals O1', O2' are inadvertently short-circuited and that the signal is rising in potential so as to render output transistor Q7' conductive. Because of the short-circuit, output terminal O1' remains at ground potential. The emitter of output transistor Q7' can thus rise above ground potential only by the relatively small amount of the voltage drop across resistor R17', and hence the collector-to-emitter voltage of output transistor Q7' remains high. As the emitter current from transistor Q7' flows through the short-circuit at the output terminal O1', O2' the potential at the left-hand end of resistor R17' rises so as to forward-bias the base-emitter junction of transistor Q9'. Resistor R16' does not in this instance provide a reverse-bias signal since the emitter of transistor Q9' remains at ground potential due to the short-circuit across output terminals O1', O2'. Transistor Q9' thus becomes conductive to forward-bias diode D3' and draw current downwardly through collector load resistors R7', R8'. The positively swinging signal at the base of transistor Q3' is thereby instantaneously clipped so as to prevent further drive through drive transistor Q5' to output transistor Q7'. The operating point of the latter is thereby prevented from rising toward the region of high collector current and second breakdown.

It will be apparent that when output transistor Q8' is conductive transistor Q10' will function in a similar manner in response to a short-circuit across output terminals O1', O2' to clip the signal potential at the base of transistor Q3' and thereby prevent the operating point of output transistor Q8' from exceeding the second breakdown limit. It will be seen that the above-described mode of operation will also be effective when the load across output terminals O1, O2 is of low magnitude so as to present an excessively steep load-line or is highly reactive such as may be due to a crossover network or to a low-frequency transient.

The preferred parameters of the protective circuit components are as follows: resistor R17':0.56 ohm; resistors R14', R15':100 ohms; resistors R16', R18':1,000 ohms.

The power supply comprises a transformer T having a primary winding T1 connected through a slow-blow fuse F3 to the usual alternating-current house line of about 117 volts applied at line terminals L1, L2. The transformer secondary winding T2 is provided with a center-tap grounded as shown. A conventional full-wave rectifier bridge comprising rectifiers D5', D6', D7', D8' is connected to the transformer secondary winding T2 and also to the filter capacitors C7' and C8'. The junction of the latter is connected to ground at the negative terminal of capacitor C7' and the positive terminal of capacitor C8'. The positive terminal of capacitor C7' constitutes the B+ terminal of the power supply and the negative terminal of capacitor C8' constitutes the B− terminal of the power supply. Fast-blow instrument fuses F1, F2 are in the B+ and B− supply lines respectively.

Output transistors Q7', Q8' are preferably biased in the cutoff region so as to operate in the Class B mode. If both transistors are silicon types then the base-emitter quiescent voltage of each transistor may be about 300 millivolts which is substantially below the cut-in voltage. Therefore no quiescent current flows through output transistors Q7', Q8' except for a negligible leakage current, and hence there is no problem of thermal runaway.

Crossover distortion is obviated by the unity-gain feedback loop formed by the connection of output bus O' to the emitter of transistor Q3' and the two stages of voltage gain provided by transistors Q3' and Q4'. The portion of the amplifier following the collector of transistor Q2' operates effectively in the emitter-follower mode with consequent low distortion notwithstanding the cutoff Class B bias of the output stage. That is, any slight difference between the signal potential at the base of transistor Q3' and that at output bus O' constitutes an error signal which is impressed across the base-emitter junction of transistor Q3'. This error signal is amplified by the latter and then further amplified again by transistor Q4' so as to provide a doubly-amplified signal to the drive and output stages with a polarity and magnitude to correct for the error originally sensed at the base-emitter junction of transistor Q3'.

The complementary nature of the output stage is critical in this arrangement. The large amount of feedback provided with the unity-gain inner feedback loop and the outer feedback loop is made feasible by the symmetry of the complementary drive and output stages in that phase-shift characteristics and correction networks suitable for one-half of these push-pull stages are also suitable for the other half so that adequate high-frequency stability margins are obtainable for both positive and negative portions of the signal swing. In the present state of the semiconductor art the use of a quasi-complementary drive-output arrangement in combination with a unity-gain inner feedback loop would inevitably result in "ringing," oscillation or other manifestation of inadequate stability margin on at least either the positive or negative portion of the signal.

The unity-gain feedback to the emitter of transistor Q3' is further advantageous in that it extends the frequency response of the stages within the inner feedback loop, thereby improving the high-frequency stability margin of the outer feedback loop formed by the feedback to the emitter of the first stage transistor Q1', in accordance with the mode of operation described above with respect to the embodiments of FIGS. 3 and 4.

In FIG. 1a there is shown a heavy dash-dot line enclosing a subnetwork comprising the unity-gain feedback loop and the protective circuit including transistors Q9', Q10'. This subnetwork is designated by the reference letter A and is indicated symbolically in the below-described embodiment of FIG. 4a to simplify the disclosure of the latter and to avoid repetition of the details of subnetwork A. To show connections to the latter, five nodes thereof are identified in FIG. 1a by the reference designations N1 to N5 inclusive.

These nodal reference designations are also used in FIGS. 2a and 3a to show the manner in which modified forms of the first two stages are connected to the subnetwork A at the respective nodes. Referring first to FIG. 2a, hot input terminal I3 is coupled by capacitor C9 and resistor R19 to the base of a PNP transistor Q11 operating Class A in the common-emitter mode. The source of reference potential is at ground level and a bias resistor R20 extends from ground to the base of transistor Q11. A load resistor R21' extends from the collector of transistor Q11 to node N5. The other input terminal I4 is connected to ground.

Alternating-current and direct-current feedback, as well as a quiescent bias voltage, are applied to the emitter of transistor Q11 by the following circuit arrangement. A capacitor C10 and resistor R21 extend in series from ground to the emitter of transistor Q11. Also connected to said emitter is one end of a feedback resistor R22 having its other end connected to the positive terminal of a diode D9 the negative terminal of which is connected to node N2 which in turn is connected to output bus O' of subnetwork A. A resistor R23 extends from the positive terminal diode D9 to node N1 in turn connected to the B+ supply terminal, and another resistor R24 extends from node N2 to node N5 in turn connected to the B− supply terminal.

The collector of transistor Q11 is direct-coupled to the base of an NPN transistor Q12 also operating Class A in the common-emitter mode. The emitter of transistor Q12 is connected to node N5 and its collector is connected to node N3 in turn connected to the base of transistor Q3' of subnetwork A. A high-frequency phase shift capacitor C11 may be provided from the collector to the base of transistor Q12. A pair of load resistors R22', R23' extend in series from the collector of transistor Q12 to node N1. A bootstrapping capacitor C11' extends from mode N2 to the junction of resistors R22', R23'.

It will be seen that resistor R23 and diode D9 constitute a voltage divider to maintain the potential at the right-hand end of resistor R22 at a predetermined constant level above the potential of output bus O'. Hence the quiescent potential of the latter may be at ground level and the voltage drop across diode D9 compensates for the voltage drops across the base-emitter junction of transistor Q11 and across bias resistor R20.

Referring now to FIG. 3a, there is shown another modified form of the first two stages which may be direct-coupled in cascade with subnetwork A. The hot input terminal 15 is coupled by capacitor C12 and resistor R25' to the base of a PNP transistor Q13. Also connected to the base is one end of a bias resistor R25 having its opposite end connected to ground to which is also connected the other input terminal I6. Since the source of reference potential is the ground itself the voltage of this source must obviously remain fixed with respect to ground irrespective of variations in the power supply, junction temperature, component parameters or other changes.

The emitter of transistor Q13 is provided with alternating-current and direct-current feedback signals and a quiescent bias potential in the following manner. A resistor R26 has one end connected to the emitter of transistor Q13 and its other end connected to a capacitor C14 in turn connected to ground. A resistor R28 extends from node N1 to one end of a variable resistor in the form of a potentiometer P having its other end connected to node N2. A bypass capacitor C13 is connected in parallel across potentiometer P. A feedback resistor R27 extends from the lower end of resistor R28 to the emitter of transistor Q13. A resistor R29 extends between node N2 and node N5.

Resistor R28 and potentiometer P function as a voltage divider to maintain the potential of the right-hand end of resistor R27 at a constant level above the potential of output bus O' of subnetwork A. Should the quiescent potential of output bus O' tend to drift with respect to ground so as to provide a direct-current offset, the potential at the right-hand end of resistor R27 will vary therewith so as to provide a direct-current feedback signal to the emitter of transistor Q13 with a magnitude and of a polarity to counteract this tendency.

The collector of transistor Q13 is provided with a load resistor R26' extending to node N5 in turn connected to the B− supply terminal. The base of the second stage transistor Q14 is direct-coupled to the collector of transistor Q13. A pair of load resistors R30, R31 extend in series from the collector of transistor Q14 to node N1 which is in turn connected to the B+ supply terminal. A bootstrapping capacitor C15 extends from node N2 to the junction of resistors R30, R31. A phase-shift capacitor C14' may be provided between the collector and base of transistor Q14. The emitter of the latter is connected to node N5 in turn connected to the B− supply terminal. The collector of transistor Q14 is direct-coupled to node N3 and therefore to the base of transistor Q3' of subnetwork A.

Figure 4A:
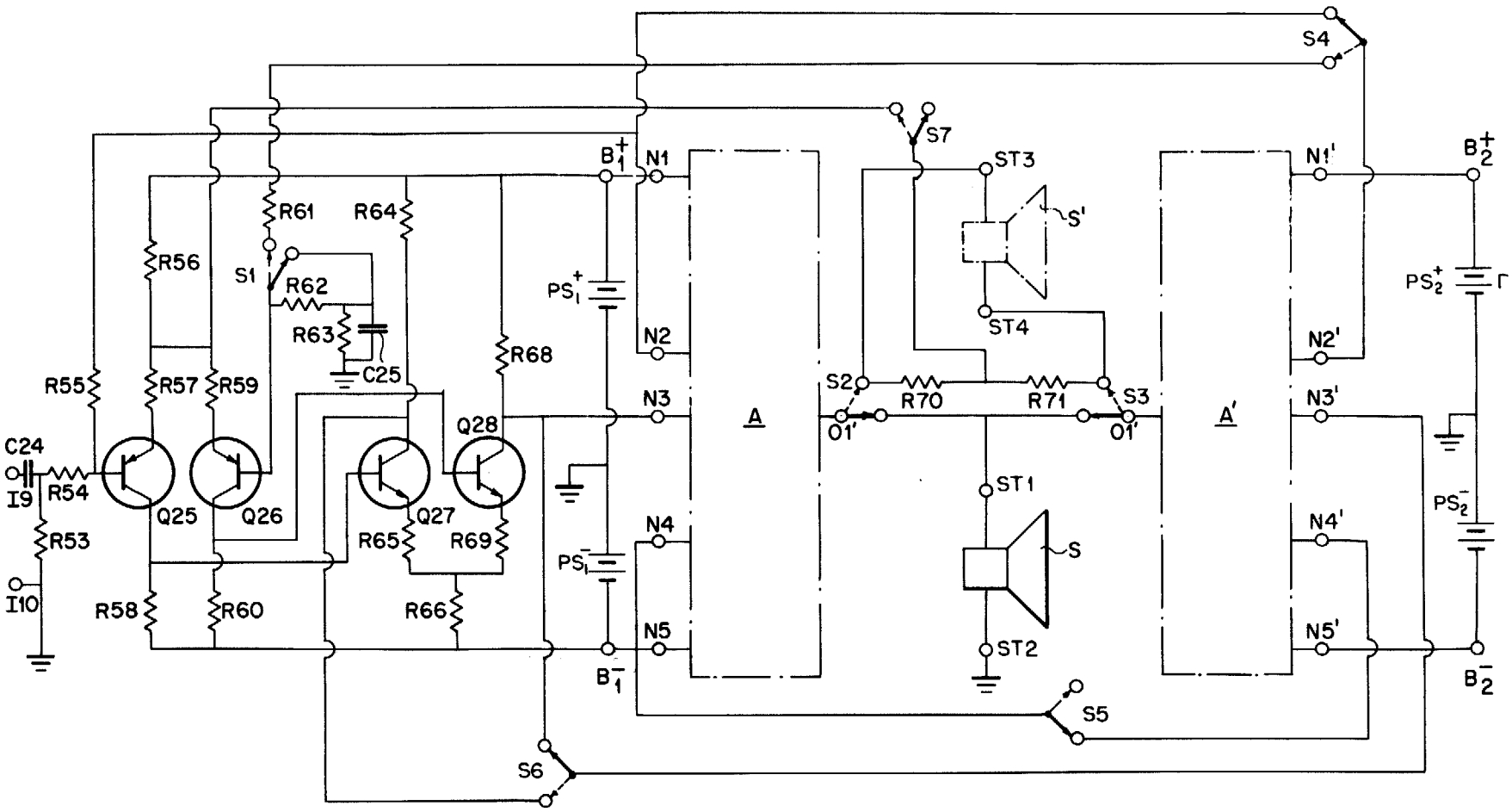
FIG. 4a shows another modified form of the invention wherein each common-emitter stage comprises a symmetrical pair of emitter-coupled transistors; [and]

In FIG. 4a there is shown another embodiment of the present invention wherein each of the common-emitter stages consists of two emitter-coupled transistors arranged substantially symmetrically so as to operate in the well-known differential amplifier node. Insofar as the direct-current coupling aspect of the invention is concerned it is immaterial as to whether each common-emitter stage is embodied in the form of a single grounded-emitter transistor or in the form of a pair of emitter-coupled transistors since these forms are known equivalent and provide the same mode of operation for the amplifier circuit as a whole. However, the symmetrical differential stages of FIG. 4a are advantageous in that the second common-emitter stage provides oppositely-phased push-pull signal, which may be utilized to drive the respective opposite halves of a full-bridge output arrangement, as will be described below.

Referring to FIG. 4a in more detail, the hot input terminal I9 is coupled by capacitor C24 and resistor R54 to the base of a PNP transistor Q25. The other input terminal I10 is connected to ground from which extends a bias resistor R53 to the junction of resistor R54 and capacitor C24. The first common-emitter stage further comprises a second PNP transistor Q26 having its base biased by a pair of resistors R62, R63 extending in series to ground. In the solid-line position of switch S1 resistor R62 is shorted. Resistor R63 is bypassed by a capacitor C25.

The emitters of transistors Q26', Q26 are coupled by a pair of bias resistors R57, R59 of relatively small magnitude and a resistor R56 of relatively large magnitude presents a substantially constant current source to the emitters. Resistor R56 extends from the $B_1$+ supply terminal to the junction of resistors R57, R59. Load resistors R58, R60 extend from the respective collectors of transistors Q25, Q26 to the $B_1$− supply terminal. The split power supply is indicated schematically by the battery symbols designated $PS_1$+ and $PS_1$− respectively. The center-tap of this split power supply is grounded as shown.

The second common-emitter stage is also of the symmetrical emitter-coupled type operating in the differential amplifier mode but in this stage the transistors Q27, Q28 are type NPN. The base of transistor Q27 is direct-coupled to the collector of transistor Q25 and the base of transistor Q28 is direct-coupled to the collector of transistor Q26. The emitters of transistors Q27, Q28 are coupled through bias resistors R65, R69 connected at a common junction from which extends a resistor R66 to the $B_1$− supply terminal. Load resistors R64, R68 extend from the respective collectors of transistors Q27, Q28 to the $B_1$+ supply terminal.

The collector of transistor Q28 is direct-coupled to node N3 of subnetwork A indicated schematically in FIG. 4a and disclosed in detail in FIG. 1a. Node N1 of subnetwork A is connected to the $B_1$+ supply terminal and node N5 is connected to the $B_1$− supply terminal. A feedback resistor R55 extends from node N2 to the base of transistor Q25 to provide both direct-current and alternating-current feedback from output bus O' of subnetwork A. Output terminal O1' of subnetwork A is connected to the hot terminal S11 of loudspeaker S when switch S2 is in the solid-line position shown. The other terminal ST2 of loudspeaker S is grounded.

Figure 4B:
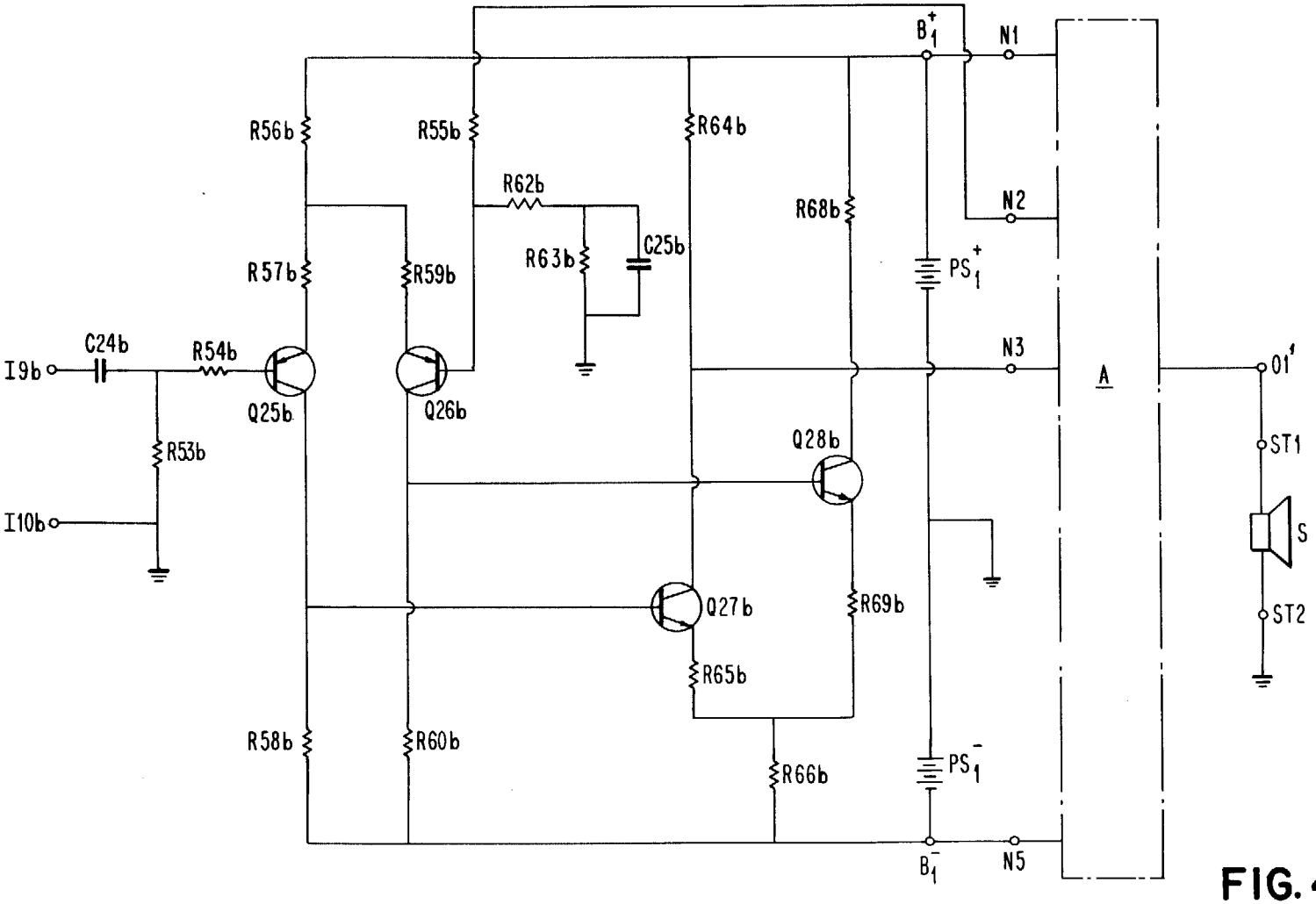
*FIG. 4b shows a modified form of the invention and consisting of a subcombination of the circuit of FIG. 4a; and*

That portion of FIG. 4a thus far described constitutes a complete amplifier and operates in a manner similar to that shown in FIG. 1a. The PNP common-emitter stage Q25, Q26 of FIG. 4a is the equivalent of PNP transistor Q1' of FIG. 1a, and similarly, the NPN common-emitter stage Q27, Q28 of FIG. 4a is equivalent to transistor Q2' of FIG. 1a. In FIG. 4a the feedback is applied through resistor R55 to the base of transistor Q25 rather than to the emitter of the first stage transistor as in FIG. 1a because the signal at the collector of transistor Q28 is out-of-phase with that at input terminal I9. If desired, the output of the second common-emitter stage may be taken instead from the collector of transistor Q27 which may be connected to node N3 to transmit to the latter a signal in-phase with that at input terminal I9. In this event the feedback may be applied to the base of transistor Q26 which will then transmit the feedback signal to the emitter of transistor Q25, thereby providing substantially the same feedback arrangement as that shown in FIGS. 2, 4, 8, 9 and 1a. *This arrangement is shown in FIG. 4b wherein the*

*components are designated by the same reference numerals as the corresponding components in FIG. 4a, followed by the suffix "b".*

By virtue of the in-phase and out-of-phase signals at the collectors of transistors Q27 and Q28 respectively, the embodiment of FIG. 4a permits the utilization of two single-ended half bridge drive-output circuits to be connected either in a parallel mode similar to that shown in FIG. 6 or in a full-bridge series mode similar to that shown in FIG. 7. The second drive-output circuit is designated in FIG. 4a as A' and may be identical to subnetwork A. Subnetwork A' together with its own split power supply $PS_2+$, $PS_2-$ may be mounted on an auxiliary chassis separate from the chassis containing subnetwork A and the common-emitter stages, and this auxiliary chassis may be marketed separately as an auxiliary power booster.

More specifically, node N1' of subnetwork A' is connected to the $B_2+$ supply terminal and node N5' is connected to the $B_2-$ supply terminal. When switch S3 is in the solid-line position shown the output terminal O1' of subnetwork A' is connected to speaker terminal ST1 so that subnetworks A and A' are connected in parallel with respect to loudspeaker S. This would be the preferred mode of operation if loudspeaker S is of relatively low impedance, such as four ohms or less. In this parallel mode of operation switches S4 and S5 are in the position shown in solid lines so as to connect nodes N2' and N4' of subnetwork A' to nodes N2 and N4 respectively of subnetwork A. Node N3' of subnetwork A' is similarly connected to node N3 of subnetwork A by the solid-line position of switch S6.

For use with loudspeakers of eight ohms or higher impedance the full-bridge series mode of operation may be preferred in order to obtain greater power. The connections for this mode of operation are indicated by the dashed-line positions of the respective switches which thereby connect subnetworks A and A' in series with respect to loudspeaker S' shown in dash-dot lines. In this series mode of operation it will be seen that switches S2 and S3 connect the respective output terminals O1' of subnetworks A and A' to the speaker terminals ST3 and ST4 of loudspeaker S'. Switch S6 connects the collector of transistor Q27 to node N3' of subnetwork A' so that the latter is driven in opposite phase to that of the signal derived from the collector of transistor Q28 which drives subnetwork A. Switches S1 and S4 connect node N2' through feedback resistor R61 to the base of transistor Q26 to provide a negative feedback signal to the latter. Switch S5 opens so that node N4' is no longer connected to node N4.

In this full-bridge mode of operation any tendency to direct-current drift of output terminals O1' from ground potential is reduced by the common-mode feedback provided by resistors R70, R71 extending in series between output terminals O1'. Switch S7 connects the junction of these resistors to the lower end of emitter resistor R56 of the first stage to apply thereto a direct-current degenerative feedback signal.

Another advantage of the circuit of FIG. 4a resides in the reverse-bias of the base-emitter junction of the "off" output transistor during its non-conductive half of the cycle. This raises the breakdown voltage of the output transistor and also improves its high-frequency performance by rapidly sweeping out the majority carriers from the base to permit the transistor to be quickly turned off near the crossover point.

Referring now to FIG. 5a, there is shown a well-known prior circuit utilizing an output coupling capacitor and referred to above in the description of the prior art. The basic configuration of this circuit was first disclosed by H. C. Lin, "Quasi-Complementary Transistor Amplifier," Electronics, Sept. 1956, pp. 173–175. The hot input terminal I11 is coupled by capacitor C26 to the base of transistor Q29 operating Class A in the common-emitter mode with its emitter grounded as shown. A bias resistor R72 extends from the base to ground and the other input terminal I12 is also grounded. Extending in series to the collector of transistor Q29 from the B+ terminal of the power supply indicated symbolically by the battery symbol designated PS are collector load resistors R73, R74, temperature-compensating bias diodes D16, D17 and a bias resistor R75.

The drive stage is the quasi-complementary type and comprises an NPN transistor Q30 and an PNP transistor Q32. The collector of transistor Q30 is connected to the B+ supply terminal and its base is direct-coupled to the lower end of load resistor R74. A bias resistor R76 extends from the emitter of transistor Q30 to the output bus O. Connected to the latter is the emitter of transistor Q32 having its base direct-coupled to the collector of transistor Q29. A collector load resistor R77 extends from the collector of transistor Q32 to ground.

The output stage comprises a pair of NPN transistors Q32, Q33. The base of transistors Q32 is direct-coupled to the emitter of drive transistor Q30, and the base of transistor Q33 is direct-coupled to the collector of drive transistor Q32. The collector of output transistor Q31 is connected to the B+ supply terminal and its emitter is connected to output bus O to which is also connected the collector of output transistor Q33 having its emitter grounded as shown.

Extending from output bus O to the junction of load resistors R73, R74 of the first stage is the usual bootstrapping capacitor C27. A variable resistor in the form of a potentiometer P extends from output bus O to the base of transistor Q29 to provide bias and direct-current feedback to this stage.

Output bus O at the midpoint of the output stage Q31, Q33 is connected by output coupling capacitor C28 to the hot output terminal O3. The other output terminal O4 is grounded and the loudspeaker S is connected between output terminals O3, O4. An alternating-current feedback network comprising a resistor R78 and phase-shift capacitor C29 extends from output terminal O3 to the base of transistor Q29.

Some of the disadvantages of this prior art circuit have been mentioned briefly above in the description of the prior art reference thereto will now be made in conjunction with the specific structure disclosed in FIG. 5a. Since transistor Q29 is the only stage which provides voltage gain, the amount of alternating-current negative feedback which may be applied is limited in order not to reduce the sensitivity of the amplifier to the point where an excessively large input signal is required for full power output. In order to provide more voltage gain and feedback, at least one more common-emitter Class A stage is often added before transistor Q29 and within the forward transmission path of the outer feedback loop.

The addition of a single common-emitter stage before transistor Q29 does not result in a substantial reduction in distortion because only a moderate increase in voltage gain is achieved and this is partially offset by the distortion in the added stage. The gain increase is moderate because the inner feedback network P to the base of transistor Q29 results in an extremely low input impedance seen by the added stage which is thus provided with a steep load-line. This loading of the added stage also results in the generation of nonlinear distortion therein.

Therefore, two mutually direct-coupled stages are frequently added before capacitor C26 and transistor Q29. Although sufficient gain to permit a substantial amount of feedback in the outer loop is thereby made available, other disadvantages arise from this expedient. There result two additional stages of high-frequency roll-off and the accompanying phase shifts reduce the stability margin of the outer feedback loop. Also, the outer feedback network R78, C29 must now be returned to the base of the initial added transistor resulting in a low impedance at the input terminals of the amplifier and thereby loading down the preamplifier, tuner or other preceding component.

In an effort to eliminate these disadvantages another attempted solution is to direct-couple two initial common-emitter stages and capacitor-couple the second of these stages to the drive stage. This eliminates the inner feedback network and the gain loss and distortion produced thereby in the stage preceding the network.

These expedients, although providing sufficient negative feedback, nevertheless render the stability margins inadequate at both frequency extremes. With respect to low frequencies, the forward transmission path then includes two phase-shift producing roll-offs in the form of coupling capacitors C26 and C28. Separation of the two roll-off frequencies is limited by the low impedance in the stages before and after capacitor C26. With the application of sufficient feedback the poles of the overall transfer function become complex so as to produce a spurious oscillatory response known as "breathing" when subjected to transient signals. With respect to high frequencies, coupling capacitors C26 and C28 provide both series inductance and stray shunt capacitance so as to substantially reduce the stability margin.

Furthermore, the interstage coupling capacitor changes its state of charge in response to overload signal peaks or saturation of the following stage. During the finite time for recovery by capacitor C26 of its original state of charge the bias on transistor Q29 is disturbed so as to cause distortion or even complete "blocking" of the amplifier.

Other disadvantages of output coupling capacitor C28 are the generation of transient distortion due to a disturbance in the bias condition of an early stage and produced by a low-frequency instability or by a heavy pulse having a substantial direct-current component which changes the charge condition of capacitor C28. The latter further provides a reactive load resulting in an elliptical load-line so that in response to low-frequency transient signals the operating point of output transistor Q31 or Q33 may enter a region of simultaneously high voltage and current so as to result in "second breakdown" of the transistor.

Several terms and phrases which appear throughout the claims are hereby defined as follows. The expressions "source of reference potential" and "reference node" refer to either ground or a node maintained at a regulated potential different from ground potential. The terms "network" and "circuit means" and similar expressions are generic to both active networks, including transistors and passive networks consisting solely of passive components such as conductors, resistors, capacitors and inductors. The expression "direct-current-coupled" is generic to include not merely a direct coupling but any coupling which has a conductive or direct-current transmission path, and the coupling may be either by way of a passive network or an active network including a base-emitter junction or one or more transistor stages. The term "transistor" includes any semiconductor device capable of voltage and/or current amplification, whether the device be a discrete component or part of an integrated monolithic or hybrid circuit. The expression "single-ended push-pull stage" refers to either a complementary-symmetry stage wherein the transistors are of opposite polarity types or a stage wherein both transistors are of the same polarity type. The phrase "common-emitter stage" is intended to include either a single transistor or an emitter-coupled differential pair of transistors.

It is to be understood that the various forms of invention shown in the drawings and described in detail above are merely illustrative and that numerous modifications thereof will readily occur to those skilled 2,896,029, the art without departing from the scope of the invention as delineated in the appended claims which are to be construed as broadly as permitted by the prior art.

REFERENCES CITED IN PRIOR APPLICATION SER. NO. 388,399

U.S. Pat. Nos. 2,798,164, Stanley, Apr. 1957; 2,847,519, Aronson, Aug. 1958; 2,851,542, Lohman, Sept. 1958; 2,860,195, Stanley, Nov. 1958; 2,863,008, Keonjian, Dec. 1958; 2,896,029, Lin, July 1959; 2,955,258, Wheatley, Oct. 1960; 3,018,445, Stone, Jan. 1962; 3,023,368, Erath, Feb. 1962; 3,042,875, Higginbotham, July 1962; 3,246,251, Sheppard, Apr. 1966.

I claim:

[1. A transistor power amplifier comprising a single-ended push-pull output stage including at least two transistors connected in series at a midpoint of the stage, a split power connected to said output stage and having a center-tap, a pair of output terminals, means D.C.-coupling one of said output terminals to said center-tap, means D.C.-coupling the other output terminal to said output stage midpoint, a complementary-symmetry push-pull drive stage, means D.C.-coupling said drive stage to said output stage, amplification means, means D.C.-coupling said amplification means to said drive stage, and a D.C. feedback network extending from said output stage to said amplication means for maintaining said output terminals at substantially the same D.C. potential.]

[2. An amplifier as recited in claim 1 wherein one end of said feedback network is D.C.-coupled to said other output terminal, said amplification means having a negative feedback signal injection node, the other end of said feedback network being D.C.-coupled to said signal injection node so as to form a D.C. negative feedback loop comprising said amplification means, drive stage, output stage and feedback network.]

[3. An amplifier as recited in claim 2 wherein said amplification means comprises a common-emitter stage including a transistor having an input circuit electrode and a collector, means D.C.-coupling said collector to said drive stage, said amplifier having a ground, resistance means having one end connected to said electrode, and zener diode means maintaining the other end of said resistance means at a substantially fixed potential with respect to said ground.]

[4. An amplifier as recited in claim 2 wherein said amplification means comprises a transistor having a base constituting said feedback signal injection node, said other end of said feedback network being D.C.-coupled to said base.]

[5. In combination, a pair of amplifiers each as recited in claim 2, and means for connecting said amplifiers alternatively in either a stereo mode, or a parallel mode or a series mode, in said stereo mode each of said amplifiers having respective independent input and output terminals so as to constitute two independent channels, in said parallel mode said amplifiers having a common input and having their outputs mutually D.C.-coupled to each other and to the load, in said series mode one of said amplifiers having phase reversal means so as to operate in opposite phase to the other amplifier and said amplifiers each having its respective output D.C.-coupled to a respective opposite end of the load.]

[6. A transistor power amplifier as recited in claim 1 wherein said amplification means comprises at least one transistor operating in the commo-emitter mode and having a base and an emitter, said drive stage comprising at least two complementary transistors each having an emitter, an A.C. ground, means connecting said amplification transistor emitter to said A.C. ground, means connecting said drive transistor emitters to said output stage midpoint, said D.C. feedback network including a passive impedance having one end D.C.-coupled to said output stage and its other end D.C.-coupled to said amplification transistor base.]

7. [In combination, an amplifier as recited in claim 1,] *A transistor power amplifier comprising a single-ended push-pull output stage including at least two transistors connected in series at a midpoint of the stage, a split power supply connected to said output stage and having a center-tap, a pair of output terminals, means D.C.-coupling one of said output terminals to said center-tap, means D.C.-coupling the other output terminal to said output stage midpoint, a complementary-symmetry push-pull drive stage, means D.C.-coupling said drive stage to said output stage, amplification means, means D.C.-coupling said amplification means to said drive stage, and a D.C. feedback network extending from said output stage to said amplification means for maintaining said output terminals at substantially the same D.C. potential*, preamplifier means connected in cascade with said amplifier, an inner negative feedback loop including said amplifier for raising the high-frequency cutoff of said amplifier to a predetermined frequency, said preamplifier means comprising a transistor stage preceding said inner feedback loop, said transistor stage having a high-frequency cutoff substantially lower than said predetermined frequency, and an outer negative feedback loop including said amplifier and said preamplifier transistor stage.

[8. A transistor power amplifier as recited in claim 1 wherein said amplification means comprises at least a first transistor of one polarity type and a second transistor of complementary type and each transistor having a collector and a base, a network D.C.-coupling the first transistor collector to the second transistor base, a ground, a bias reference node maintained at a potential relatively fixed with respect to said ground and independent of potential variations in said power supply, bias means connecting said bias reference node to said first transistor base to supply bias current to the latter, said drive stage comprising at least two complementary transistors each having an emitter and a base, network means constituting D.C. transmission paths from said second transistor collector to said drive transistor bases, and means connecting said drive transistor emitters to said output stage midpoint.]

[9. In combination, an amplifier as recited in claim 1, preamplifier means connected in cascade with said amplifier, an inner negative feedback loop including said amplifier for lowering the high-frequency cutoff of said amplifier to a predetermined frequency, said preamplifier means comprising a transistor stage preceding said inner feedback loop, said transistor stage having a high-frequency cutoff substantially higher than said predetermined frequency, and an outer negative feedback loop including said amplifier and said preamplifier transistor stage.]

[10. In combination, a pair of amplifiers each as recited in claim 1, and means for connecting said amplifiers alternatively in either a parallel mode or a series mode, in said parallel mode said amplifiers having a common input and having their outputs mutually D.C.-coupled to each other and to the load, in said series mode one of said amplifiers having phase reversal means so as to operate in opposite phase to the other amplifier and said amplifiers each having its respective output D.C.-coupled to a respective opposite end of the load.]

[11. A transistor power amplifier as recited in claim 1 wherein said amplification means comprises a first transistor of predetermined polarity type and a second transistor of opposite polarity type, said first and second transistors each having a collector, a base and an emitter, bias means maintaining said first transistor base at a relatively fixed direct-current quiescent potential independent of potential variations of said power supply, an auxiliary power supply having a supply terminal, a load impedance extending from said auxiliary supply terminal to said first transistor collector, a network direct-current coupling said first transistor collector to said second transistor base, means direct-current coupling said second transistor collector to said drive stage, an alternating-current ground, means connecting said second transistor emitter to said alternating-current ground, and means transmitting the D.C. feedback network signal to said first transistor emitter.]

[12. A transistor power amplifier as recited in claim 11 wherein said output stage comprises at least two output transistors each having a base, an emitter and a collector, means D.C.-coupling the emitter of one output transistor and the collector of the other output transistor to said output terminal, said complementary drive stage comprising at least two drive transistors of opposite polarity type and each having a base, an emitter and a collector, circuit means providing a D.C. transmission path from the emitter of one of said drive transistors to the base of one of said output transistors, circuit means providing a D.C. transmission path from the collector of the other drive transistor to the base of the other output transistor, and circuit means providing D.C. transmission path from said collector of said second transistor to the respective bases of said drive transistors.]

[13. A transistor power amplifier as recited in claim 1 for driving a loudspeaker and reproduction thereby without audible distortion by said amplifier of a high-fidelity music signal fed thereto and wherein said drive stage comprises a pair of transistors each having a base and an emitter, said D.C.-coupling means including network means having D.C. transmission paths from said amplification means to said drive stage bases, and means conductively connecting said drive stage emitters to said other output terminal whereby in response to a short-circuit failure of one of said output transistors one of said drive stage transistors will conduct current from the power supply in a path bypassing the loudspeaker so as to prevent damage to the latter.]

[14. A transistor power amplifier as recited in claim 1 wherein said output stage comprises a pair of complementary transistors, said drive stage comprising a pair of complementary transistors each direct-current coupled to a respective one of said output transistors, second amplification means connected in cascade between said first-recited amplification means and said drive stage, and an inner second feedback network extending around said output and drive stages and said second amplification means.]

[15. A transistor power amplifier as recited in claim 14 and comprising means biasing each of said output stage transistors in the cutoff region for Class B operation thereof, said inner feedback network reducing the crossover distortion generated by the Class B output stage.]

[16. A transistor power amplifier as recited in claim 15 wherein said inner feedback network provides substantially unity gain in the subcircuit consisting of the second amplification means and drive and output stages.]

[17. A transistor power amplifier as recited in claim 16 wherein said second amplification means comprises a transistor having a base, a collector and an emitter, first network means coupling said first-recited amplification means to said base, and second network means coupling said collector to said drive stage, said inner feedback network being connected to said emitter, whereby said subcircuit effectively operates in the emitter-follower mode with the potential of said other output terminal substantially following that of said second amplification means transistor emitter.]

[18. A transistor power amplifier as recited in claim 17 wherein said second amplification means transistor is of a predetermined polarity type, said second amplification means including a second transistor of a polarity type opposite thereto and having a base coupled to the collector thereof and a collector coupled to said drive stage.]

[19. A transistor power amplifier as recited in claim 18 wherein each of said output stage transistors comprises a base and an emitter connected to said output stage midpoint, each of said drive stage transistors comprising a base and an emitter connected to a respective one of said output stage transistor bases, said collector of said second transistor of said second amplification means being connected to said drive stage transistor bases.]

20. A transistor power amplifier [as recited in claim 1] for reproduction without audible distortion by said amplifier of a high-fidelity music signal and *comprising a single-ended push-pull output stage including at least two transistors connected in series at a midpoint of the stage, a split power supply connected to said output stage and having a center-tap, a pair of output terminals, means D.C.-coupling one of said output terminals to said center-tap, means D.C.-coupling the other output terminal to said output stage midpoint, a complementary-symmetry push-pull drive stage, means D.C.-coupling said drive stage to said output stage, amplification means, means D.C.-coupling said amplification means to said drive stage, and a D.C. feedback network extending from said output stage to said amplification means for maintaining said output terminals at substantially the same D.C. potential, and* wherein said amplification means comprises at least a first transistor of one polarity type and a second transistor of complementary type and each transistor having a collector, a base and an emitter, network means constituting a D.C. signal transmission path from the first transistor collector to the second transistor base, a ground, bias means maintaining said first transistor base at a quiescent D.C. potential relatively fixed with respect to said ground, means A.C.-coupling said second transistor emitter to said ground, said feedback network transmitting a feedback signal to vary the potential at said first transistor emitter, *said feedback network being connected to said first transistor emitter, and means for transmitting an input signal to said first transistor base.*

[21. A transistor power amplifier as recited in claim 20 wherein said power supply includes a pair of supply terminals of opposite polarities with respect to ground, means for conducting current and a ripple component therewith to said supply terminals at varying voltage levels dependent upon the load regulation characteristics of said power supply as increased load current is drawn therefrom, and said bias means maintaining the quiescent potential of said base at a substantially fixed voltage with respect to said ground and independent of said ripple component and load regulation characteristic of the power supply.]

[22. A transistor power amplifier as recited in claim 1 for driving a loudspeaker and reproduction thereby without audible distortion by said amplifier of a high-fidelity music signal fed thereto and wherein said amplification means comprises at least a first transistor of one polarity type and a second transistor of complementary type and each transistor having a collector, a base and an emitter, a network D.C.-coupling the first transistor collector to the second transistor base, an A.C. ground, a bias reference node maintained at a potential relatively fixed with respect to said ground and independent of potential variations in said power supply, bias means connecting said bias reference node to said first transistor base to supply bias current to the latter, means connecting said second transistor emitter to said ground, said feedback network transmitting a feedback signal to vary the potential at said first transistor emitter, said drive stage comprising at least two complementary transistors each having an emitter and a base, network means constituting D.C. transmission paths from said second transistor collector to said drive transistor bases, and means conductively connecting said drive transistor emitters to said output stage midpoint whereby in response to a short-circuit failure of one of said output transistors one of said drive transistors will conduct current from the power supply in a path bypassing the loudspeaker so as to prevent damage to the latter.]

[23. A transistor power amplifier as recited in claim 22 wherein said amplification means comprises at least a third transistor having a base and an emitter, means connecting said third transistor emitter to said first transistor emitter, common impedance means connecting said connected first and third transistor emitters to A.C. ground whereby said first and third transistors coact in the differential amplifier mode, said feedback network having a passive component including an impedance extending from said output stage to said third transistor base and said feedback network further having an active component including said third transistor to transmit said feedback signal to said first transistor emitter, a D.C. ground, means D.C.-coupling said power supply center-tap to said D.C. ground, said bias reference node being at D.C. ground potential, said bias means comprising resistor means extending from said reference node to said first transistor base, a second single-ended push-pull output stage, a second complementary-symmetry push-pull drive stage D.C.-coupled between said amplification means and said second output stage, and switching means for disconnecting said one output terminal from said center-tap and connecting said one output terminal to said second output stage whereby said output stages may operate in series.]

[24. A transistor power amplifier as recited in claim 22 and having a D.C. ground, said bias reference node being at the potential of said D.C. ground, said bias means comprising a relative network extending from said bias reference node to said first transistor base, a feedback signal pickoff node, and a voltage divider network connected between said power supply and said output stage midpoint to impart to said feedback pickoff node potential variations coextensive with those of said output stage midpoint, said feedback network transmitting said feedback signal from said pickoff node to said first transistor emitter.]

[25. A transistor power amplifier as recited in claim 1 wherein said amplification means comprises a transistor operating in the common-emitter mode and having a collector, base and emitter, means D.C.-coupling said collector to said drive stage, said feedback network being connected to said emitter, a ground, a semiconductor device having a diode junction with two electrodes connected thereto, means connecting one of said electrodes to said ground, and means connecting the other electrode to said base to maintain the latter at a substantially fixed reference potential.]

[26. A transistor power amplifier as recited in claim 25 wherein said semiconductor device is a zener diode.]

[27. A transistor power amplifier as recited in claim 25 wherein said semiconductor device is a transistor operating in the emitter-follower mode and having a base and emitter constituting said electrodes, resistive means connecting said emitter-follower transistor base to said ground, input signal means connected to said emitter-follower transistor base, and means D.C.-coupling said emitter-follower transistor emitter to said common-emitter transistor base to provide a D.C. bias thereto and to transmit said signal thereto.]

[28. A transistor power amplifier as recited in claim 27 wherein said amplification means comprises a second common-emitter transistor of a polarity type opposite that of said first-recited common-emitter transistor and having a base and a collector, means D.C.-coupling said first-recited common-emitter transistor collector to said second common-emitter transistor base, and means D.C.-coupling said second common-emitter transistor collector to said drive stage.]

[29. A transistor power amplifier as recited in claim 1 wherein said amplification means comprises a transistor having a collector, said drive stage including a transistor having a base, network means forming a direct-current signal transmission path from said collector to said base, said power supply having a terminal at a predetermined polarity and potential, said output stage being connected to said power supply terminal, an auxiliary power supply having a terminal at a potential of the same polarity as and of a greater magnitude than said first-recited supply terminal and substantially isolated from any ripple present at the latter, and a collector load impedance network extending from said collector to said auxiliary power supply terminal.]

[30. A transistor power amplifier comprising a first stage including a transistor having a base electrode, an emitter electrode and a collector, means transmitting an input signal to said base electrode, a ground, a potential source maintained at a substantially fixed predetermined voltage with respect to said ground independent of variations in power supplied to or drawn from said amplifier, means connecting one of said electrodes to said potential source, an output stage, circuit means providing a D.C. signal transmission path from said collector to said output stage, an output terminal adapted to be connected to a loudspeaker or other load, a passive direct-current feedback network extending from said output stage to one of said electrodes, and means D.C.-coupling said output stage to said output terminal.]

[31. A transistor power amplifier as recited in claim 30 wherein said circuit means includes a drive stage comprising at least two complementary transistors each having an emitter and a base, network means constituting D.C. transmission paths from said first stage transistor collector to said drive transistor bases, and means connecting said drive transistor emitters to said output terminal.]

[32. A transistor power amplifier as recited in claim 30 for amplifying without audible distortion a high-fidelity music signal and comprising a power supply including a pair of supply terminals of opposite polarities with respect to said ground, means for conducting current and a ripple component therewith to said supply terminals at varying voltage levels dependent upon the load regulation characteristic of said power supply as increased load current is drawn therefrom, and biasing means including said potential source for maintaining the quiescent potential of said one electrode at a substantially fixed voltage with respect to said ground and independent of said ripple component and load regulation characteristic of the power supply, and means connecting said output stage to said power supply terminals.]

[33. A transistor power amplifier as recited in claim 30 wherein said potential source is said ground, said connecting means comprising a second transistor having a base and an emitter, means connecting said last-recited base to said ground, and means connecting said last-recited emitter to said one electrode of said first-recited transistor.]

[34. A transistor power amplifier as recited in claim 33 wherein said input signal is transmitted by said second transistor to said base electrode, said last-recited emitter being direct-current coupled to said base electrode, said passive feedback network being direct-current coupled to said emitter electrode.]

35. A transistor power amplifier [as recited in claim 30 and] comprising *a first stage including a transistor having a base electrode, an emitter electrode and a collec-*

*tor, means transmitting an input signal to said base electrode, a ground, a potential source maintained at a substantially fixed predetermined voltage with respect to said ground independent of variations in power supplied to or drawn from said amplifier, means connecting one of said electrodes to said potential source, an output stage, circuit means providing a D.C. signal transmission path from said collector to said output stage, an output terminal adapted to be connected to a loudspeaker or other load, a passive direct-current feedback network extending from said output stage to one of said electrodes, and means D.C.-coupling said output stage to said output terminal,* a second stage including a transistor of a polarity type complementary to that of said first stage having a collector, a base and an emitter, a network D.C.-coupling the first stage transistor collector to the second stage transistor base, said potential source being connected to said first stage transistor base to supply bias current to the latter, means A.C.-coupling said second stage transistor emitter to said ground, said feedback network transmitting a feedback signal to vary the potential at said first transistor emitter, a drive stage comprising at least two complementary transistors each having an emitter and a base, network means constituting D.C. transmission paths from said second stage transistor collector to said drive stage transistor bases, and means connecting said drive stage transistor emitters to said output terminal.

36. A transistor power amplifier as recited in claim 35 and comprising a third transistor having a collector, a base and an emitter, means connecting said third transistor emitter to said first stage transistor emitter, common impedance means having one end connected to said connected emitters, means A.C.-coupling the other end of said impedance means to said ground whereby said first stage transistor and said third transistor coact in the differential amplifier mode, said feedback network having a passive component including an impedance extending from said output stage to said third transistor base and said feedback network further having an active component including said third transistor to transmit said feedback signal to said first stage transistor emitter, means D.C.-coupling said power supply center-tap to said ground, said bias reference node being at D.C. ground potential, a second output stage, and network means for selectably connecting said second output stage either in parallel or in series with said first output stage.

[37. A transistor power amplifier as recited in claim 35, said potential source being at the potential of said ground, a resistive network extending from potential source to said first transistor base, a feedback signal pickoff node, and a voltage divider network connected to said output stage midpoint to impart to said feedback pickoff node potential variations coextensive with those of said output stage midpoint, said feedback network transmitting said feedback signal from said pickoff node to said first stage transistor emitter.]

[38. A power amplifier comprising a first amplifier stage including an input circuit and an output circuit, an output stage having a first output terminal for direct-current coupling to one terminal of a loudspeaker or other load, a power supply connected to said output stage, a second output terminal for direct-current coupling to the other terminal of said load, first circuit means direct-current coupling said first amplifier stage output circuit to said output stage to drive the latter, a substantially fixed source of reference potential of a magnitude substantially independent of variations in the potential of said power supply, second circuit means connected to said reference potential source and said first amplifier stage input circuit to supply bias current thereto at a relatively fixed quiescent potential so as to adjust the quiescent potential of said first output terminal to that of said second output terminal, a node having a direct-current potential varying substantially proportionately to that of said first output terminal, and a passive feedback impedance direct-current coupled between said node and said first amplifier stage, thereby providing a direct-current negative feedback loop to reduce any tendency of the quiescent potential of said first output terminal to vary from that of said second output terminal.]

39. A power amplifier [as recited in claim 38] *comprising a first amplifier stage including an input circuit and an output circuit, an output stage having a first output terminal for direct-current coupling to one terminal of a loudspeaker or other load, a power supply connected to said output stage, a second output terminal for direct-current coupling to the other terminal of said load, first circuit means direct-current coupling said first amplifier stage output circuit to said output stage to drive the latter, a substantially fixed source of reference potential of a magnitude substantially independent of variations in the potential of said power supply, second circuit means connected to said reference potential source and said first amplifier stage input circuit to supply bias current thereto at a relatively fixed quiescent potential so as to adjust the quiescent potential of said first output terminal to that of said second output terminal, a node having a direct-current potential varying substantially proportionately to that of said first output terminal, and a passive feedback impedance direct-current coupled between said node and said first amplifier stage, thereby providing a direct-current negative feedback loop to reduce any tendency of the quiescent potential of said first output terminal to vary from that of said second output terminal, and* wherein said first amplifier stage comprises a first transistor of one polarity type and having a base and an emitter in said input circuit and a collector in said output circuit, said first circuit means including a second transistor of opposite polarity type and having a base and a collector, a first network direct-current coupling said first transistor collector to said second transistor base, a second network direct-current coupling said second transistor collector to said output stage, said second circuit means being connected to said first transistor base to maintain the latter at a substantially fixed quiescent potential, and said feedback impedance being connected to said first transistor emitter.

[40. A power amplifier as recited in claim 38 wherein said source of reference potential comprises a zener diode.]

[41. A power amplifier as recited in claim 38 wherein said source of reference potential comprises an emitter-follower preamplifier stage including a transistor having a base and an emitter, a reference node maintained at a relatively fixed potential, means direct-current coupling said node to said base, and means direct-current coupling said emitter to said first amplifier stage input circuit.]

[42. A transistor power amplifier comprising a split power supply having a center-tap and two supply terminals of opposite polarity, a single-ended push-pull output stage including a pair of transistors connected in series at a junction and each having one electrode connected to a respective one of said supply terminals and another electrode, a first output terminal for connection to one end of a speaker or other load, first circuit means connecting said other electrodes of said output transistors to said first output terminal, a second output terminal for connection to the other end of said load, means coupling said second output terminal to said supply center-tap, a voltage-amplification stage including a transistor having a direct-current feedback signal injection node and a collector, a direct-current feedback network for injecting into said node a feedback signal proportional to the direct-current potential of said junction, second circuit means direct-current coupling said voltage-amplification transistor collector to said output stage, said voltage-amplification transistor having a base electrode and an emitter electrode, a bias supply node having a relatively fixed voltage, a bias impedance extending from said bias supply node to one of said voltage-amplification transistor electrodes to supply bias current to said one electrode and to maintain the latter at an approximately constant direct-current potential, said other voltage-amplification transistor electrode constituting said feedback injection node and having said feedback network direct-current coupled thereto.]

[43. A transistor power amplifier as recited in claim 42 and comprising a zener diode having an electrode, said bias supply node being said zener diode electrode.]

[44. A transistor power amplifier as recited in claim 42 wherein said second circuit means comprises a second voltage-amplification transistor direct-current coupled to said first-recited voltage-amplification transistor, and a push-pull complementary-symmetry drive stage direct-current coupled to said second voltage-amplification transistor and said output stage.]

45. A transistor power amplifier [as recited in claim 44] *comprising a split power supply having a center-tap and two supply terminals of opposite polarity, a single-ended push-pull output stage including a pair of transistors connected in series at a junction and each having one electrode connected to a respective one of said supply terminals and another electrode, a first output terminal for connection to one end of a speaker or other load, first circuit means connecting said other electrodes of said output transitors to said first output terminal, a second output terminal for connection to the other end of said load, means coupling said second output terminal to said supply center-tap, a voltage-amplification stage including a transistor having a direct-current feedback signal injection node and a collector, a direct-current feedback network for injecting into said node a feedback signal proportional to the direct-current potential of said junction, second circuit means direct-current coupling said voltage-amplification transistor collector to said output stage, said voltage-amplification transistor having a base electrode and an emitter electrode, a bias supply node having a relatively fixed voltage, a bias impedance extending from said bias supply node to one of said voltage-amplification transistor electrodes to supply bias current to said one electrode and to maintain the latter at an approximately constant direct-current potential, said other voltage-amplification transistor electrode constituting said feedback injection node and having said feedback network direct-current coupled thereto, and wherein said second circuit means comprises a second voltage-amplification transistor direct-current coupled to said first-recited voltage-amplification transistor, and a push-pull complementary-symmetry drive stage direct-current coupled to said second voltage-amplification transistor and said output stage, and* wherein said voltage-amplification transistors are respectively of opposite polarity types with said second transistor having a base direct-current coupled to said collector of said first transistor, said bias impedance extending to said base electrode, said emitter electrode constituting said feedback injection node.

[46. A transistor power amplifier as recited in claim 45 and comprising an auxiliary power supply having an output substantially independent of ripple n said first-recited power supply, said bias supply node and said voltage-amplification transistors being connected to said auxiliary power supply.]

[47. A transistor power amplifier comprising a single-ended push-pull output stage having a first output terminal for direct-current coupling said stage to one end of a loudspeaker or other load, a power supply connected to said output stage, a second output terminal for direct-current coupling the other end of said load to said power supply, a preceding amplifying stage comprising a transistor having a base electrode and an emitter electrode, an active network direct-current coupling said preceding stage to said output stage, a bias network maintaining one of said electrodes at a relatively fixed direct-current quiescent potential independent of variations in the load current or in the power supply potential, and a negative feedback network responsive to the potential of said first output terminal and direct-current coupled to the other electrode for applying thereto a potential proportional to the direct-current quiescent potential of said output terminal to maintain said quiescent potential substantially equal to that of said second output terminal.]

[48. A transistor power amplifier as recited in claim 47 for reproduction without audible distortion by said amplifier of a high-fidelity music signal and wherein said transistor is of a predetermined polarity type, said active network comprising a second transistor of the opposite polarity type and having a base, said first-recited transistor having a collector, first circuit means direct-current coupling said last-recited collector to said base of the second transistor, said active network including second circuit means direct-current coupling said second transitor to said output stage.]

[49. A transistor power amplifier as recited in claim 48 wherein said bias network maintains the base electrode of said first-recited transistor of said fixed direct-current potential, said feedback network being direct-current coupled to the emitter electrode of said first-recited transistor.]

50. A transistor power amplifier [as recited in claim 49] *for reproduction without audible distortion by said amplifier of a high-fidelity music signal and comprising a single-ended push-pull output stage having a first output terminal for direct-current coupling said stage to one end of a loudspeaker or other load, a power supply connected to said output stage, a second output terminal for direct-current coupling the other end of said load to said power supply, a preceding amplifying stage comprising a transistor having a base electrode and an emitter electrode, an active network direct-current coupling said preceding stage to said output stage, a bias network maintaining one of said electrodes at a relatively fixed direct-current quiescent potential independent of variations in the load current or in the power supply potential, and a negative*

*feedback network responsive to the potential of said first output terminal and direct-current coupled to the other electrode for applying thereto a potential proportional to the direct-current quiescent potential of said first output terminal to maintain said quiescent potential substantially equal to that of said second output terminal, and wherein said transistor is of a predetermined polarity type, said active network comprising a second transistor of the opposite polarity type and having a base, said first-recited transistor having a collector, first circuit means direct-current coupling said last-recited collector to said base of the second transistor, said active network including second circuit means direct-current coupling said second transistor to said output stage, and wherein said bias network maintains the base electrode of said first-recited transistor at said fixed direct-current potential, said feedback network being direct-current coupled to the emitter electrode of said first recited transistor, and* wherein said second circuit means comprises a push-pull complementary-symmetry drive stage, third circuit means direct-current coupling said drive stage to said output stage, and fourth circuit means direct-current coupling said second transistor to said drive stage.

[51. A transistor power amplifier as recited in claim 50 wherein said bias network comprises a zener diode having a substantially predetermined breakdown voltage, and resistive means extending from said zener diode to said base electrode.]

*52. An amplifier as recited in claim 39 wherein said first amplifier stage comprises another transistor of the same polarity type as said first transistor and having a base-emitter diode including an emitter coupled to the emitter of said first transistor and also including a base connected to said feedback impedance to transmit a feedback signal in the back direction through said diode to said first transistor emitter.*

*53. In combination, a pair of amplifiers each as set forth in claim 45, and means for connecting said amplifiers alternatively in either a separate mode or a series mode, in said separate mode each of said amplifiers having respective independent input and output terminals whereby said pair of amplifiers constitute two independent channels, in said series mode said amplifiers each having its respective output direct-current-coupled to a respective opposite end of the load, means for transmitting respective different input signals to said independent input terminals when said amplifiers are connected in the separate mode, and means for transmitting a first input signal to the input terminals of a first of said amplifiers and for transmitting to the input terminals of the second amplifier a second input signal substantially identical to said first input signal but oppositely phased with respect thereto when said amplifiers are connected in the series mode.*

*54. An amplifier as recited in claim 47 and further comprising*

*a quasi-output stage in cascade with and between said drive stage and said output stage,*

*said quasi-output stage including resistive means for conducting output current from said quasi-output stage to said output terminal and then to the load at low amplifier signal levels,*

*said resistive means having a resistance of an order of magnitude approximately the same as the order of magnitude of the resistance of the load,*

*means normally biasing said output stage to the cutoff state at low amplifier signal levels, and*

*means connecting said output stage to said resistive means for driving said output stage to the active state so as to supply power to the load at high amplifier signal levels.*

*55. An amplifier as recited in claim 54 wherein said quasi-output stage comprises a pair of transistors,*

*said output stage comprising a pair of transistors each of the same polarity type as a respective one of said quasi-output stage transistors,*

*each of said quasi-output stage transistors having an emitter,*

*each of said output stage transistors having a base direct-coupled to a respective emitter of one of said quasi-output stage transistors,*

*said resistive means comprising a pair of resistors each connected to a respective emitter of one of said quasi-output stage transistors.*

*56. An amplifier as set forth in claim 47 and further comprising*

*a second drive stage in cascade with and between said first-recited drive stage and said output stage,*

*said second drive stage comprising four transistors,*

*said output stage comprising four tansistors connected in series,*

*each of said output stage transistors having a base,*

*each of said second drive stage transistors being direct-coupled to the base of a respective one of said output stage transistors,*

*two of said second drive stage transistors having a base, and*

*feedback means driven by the amplifier output for driving said two second drive stage transistor bases.*

*57. An amplifier as set forth in claim 56 wherein*

*said feedback means comprises a pair of voltage divider networks each connected between the amplifier output and a respective one of the power supply terminals,*

*each of said voltage divider networks being direct-current-coupled to a respective one of said two second drive stage transistor bases for driving the latter.*

*58. An amplifier as recited in claim 45 wherein*

*said first-recited voltage-amplification stage comprises another transistor having an emitter coupled to the emitter of said first-recited voltage-amplification transistor and having a base-emitter diode junction,*

*said feedback network including said diode junction for injecting said feedback signal into said emitter electrode constituting said feedback signal injection node,*

*and an input terminal connected to said base electrode of said first-recited voltage amplification stage transistor.*

*59. An amplifier as recited in claim 58 wherein*

*said another transistor has a base electrode,*

*said feedback network comprising at least a first resistor, a second resistor and a capacitor,*

*said first feedback network resistor having one end connected to the amplifier output and its other end connected to said base electrode,*

*a ground,*

*said second feedback network resistor and said capacitor being connected in series between said base electrode and said ground.*

*60. An amplifier as recited in claim 59 wherein*

*said bias supply node is at ground potential,*

*said bias impedance comprising at least a resistor extending from said base electrode to ground.*

*61. An amplifier as recited in claim 45 and comprising*

*an input terminal connected to said base electrode of said first-recited voltage-amplification stage transistor,*

*said first-recited voltage-amplification stage comprises another transistor having an emitter coupled to the emitter of said first-recited voltage-amplification transistor and having a base-emitter diode,*

*said feedback network including said diode for transmitting said feedback signal in the feedback direction to said emitter electrode constituting said feedback injection node,*

*said drive stage comprising at least two drive transistors each having an emitter connected to the amplifier output whereby the drive and output stages operate together in the emitter-follower mode so as to present an inherently high input impedance as seen looking into the drive stage,*

*said second voltage-amplification transistor base presenting an inherently low input impedance to the preceding first-recited voltage-amplification transistor,*

*whereby the frequency response of the second voltage-amplification transistor rolls off at a much lower frequency than the other stages of the amplifier.*

*62. An amplifier as recited in claim 45,*

*said first voltage-amplification stage transistor having a quiescent base-emitter potential difference between the base and emitter electrodes thereof,*

*a first resistive means associated with and extending between said base electrode and ground and having a first quiescent voltage thereacross,*

*a second resistive means associated with said emitter electrode and constituting at least part of said feedback network and having one end connected to said first output terminal and having a second quiescent voltage thereacross,*

*said second output terminal being substantially at ground potential,*

*network means for maintaining the quiescent potential of one of said electrodes at a level displaced from ground potential by an amount substantially equal to the sum of said quiescent base-emitter potential difference and said quiescent voltage across said resistive means associated with said other electrode to maintain the quiescent voltage of said first output terminal at substantially the same potential as said second output terminal, and*

*means for direct-current coupling the other end of said second resistive means to said emitter electrode to transmit said feedback signal to the latter in the back direction and the voltage across said coupling means being of a magnitude to enable said first output terminal quiescent voltage to be maintained at substantially the same potential as said second output terminal.*

*63. An amplifier as recited in claim 62 wherein*

*said feedback network comprises at least a first resistor, a second resistor and a capacitor,*

*said first resistor having one end coupled to said first output terminal,*

*said second resistor and said capacitor being connected in series between said other end of said first resistor and ground, and wherein*

*said drive stage presents a relatively high input impedance to said second transistor, and*

*said second transistor presents a relatively low input impedance to said first transistor,*

*whereby the high-frequency response of said second transistor rolls off at a lower frequency than that of said first transistor to increase the high-frequency stability margin of the amplifier,*

*said feedback network including a feedback resistor for transmitting a feedback signal in the back direction toward said emitter electrode of said first voltage-amplification stage transistor, and*

*conductive means distinct from said feedback resistor and connected to said emitter electrode of said first voltage-amplification stage transistor for conducting at least the major portion of the emitter current thereof.*

*64. A transistor power amplifier as set forth in claim 50 wherein*

*said output stage comprises a pair of output transistors of the same polarity type,*

*each of said output transistors having a base, an emitter and a collector,*

*means connecting the collector of a first of said output transistors to said power supply,*

*means connecting the emitter of said first output transistor to said output terminal,*

*means connecting the collector of the second output transistor to said output terminal,*

*means connecting the emitter of the second output transistor to the power supply,*

*means direct-current-coupling the emitter of a first of said drive stage transistors to the base of said first output transistor, and*

*means direct-current-coupling the collector of the second drive stage transistor to the base of said second output transistor.*

*65. In combination, a pair of amplifiers each as set forth in claim 50, and means for connecting said amplifiers alternatively in either a separate mode or a series mode, in said separate mode each of said amplifiers having respective independent input and output terminals whereby said pair of amplifiers constitute two independent channels, in said series mode said amplifiers each having its respective output direct-current-coupled to a respective opposite end of the load, means for transmitting respective different input signals to said independent input terminals when said amplifiers are connected in the separate mode, and means for transmitting a first input signal to the input terminals of a first of said amplifiers and for transmitting to the input terminals of the second amplifier a second input signal substantially identical to said first input signal but oppositely phased with respect thereto when said amplifiers are connected in the series mode.*

*66. An amplifier as recited in claim 50 wherein said direct-current-coupling renders the amplifier capable of transmitting a large low-frequency transient signal, and a dissipation-limiting protective circuit for preventing the respective operating points of the output transistors from entering a region of high dissipation.*

*67. An amplifier as recited in claim 66 wherein*

*said second transistor has an output network,*

*said dissipation-limiting protective circuit including a pair of complementary transistors each having a base, an emitter and a collector,*

*first means connecting said protective circuit transistor collectors to said output network of said second common-emitter stage,*

*resistive means for sensing the load current,*

*second means connecting said bases and emitters of said protective circuit transistors to said resistive means, and*

*a pair of resistors each having one end connected to a respective one of said protective circuit transistor bases and its opposite end connected to a node at approximately ground potential.*

*68. An amplifier as recited in clam 67 wherein said first connecting means comprises a pair of diodes each having one end connected to said collector of a respective one of said protective circuit transistors and its opposite end connected to said output network of the second transistor.*

*69. An amplifier as recited in claim 50 and further comprising*

*a quasi-output stage in cascade with and between said drive stage and said output stage,*

*said quasi-output stage including resistive means for conducting output current from said quasi-output stage to said output terminal and then to the load at low amplifier signal levels,*

*said resistive means having a resistance of an order of magnitude approximately the same as the order of magnitude of the resistance of the load,*

*means normally biasing said output stage to the cutoff state at low amplifier signal levels, and*

*means connecting said output stage to said resistive means for driving said output stage to the active state so as to supply power to the load at high amplifier signal levels.*

*70. An amplifier as recited in claim 69 wherein*

*said quasi-output stage comprises a pair of transistors,*

*said output stage comprising a pair of transistors each of the same polarity type as a respective one of said quasi-output stage transistors,*

*each of said quasi-output stage transistors having an emitter,*

*each of said output stage transistors having a base direct-coupled to a respective emitter of one of said quasi-output stage transistors,*

*said resistive means comprising a pair of resistors each connected to a respective emitter of one of said quasi-output stage transistors.*

*71. An amplifier as set forth in claim 50 and further comprising*

*a second drive stage in cascade with and between said first-recited drive stage and said output stage,*

*said second drive stage comprising four transistors,*

*said output stage comprising four transistors connected in series,*

*each of said output stage transistors having a base,*

*each of said second drive stage transistors being direct-coupled to the base of a respective one of said output stage transistors,*

*two of said second drive stage transistors having a base, and*

*feedback means driven by the amplifier output for driving said two second drive stage transistor bases.*

*72. An amplifier as set forth in claim 71 wherein*

*said feedback means comprises a pair of voltage divider networks each connected between the amplifier output and a respective one of the power supply terminals,*

*each of said voltage divider networks being direct-current-coupled to a respective one of said two second drive stage transistor bases for driving the latter.*

*73. An amplifier as recited in claim 50 and comprising a diode connected to said emitter electrode for transmitting thereto in the feedback direction a feedback signal flowing through said feedback network,*

*and an input terminal connected to said base electrode of said preceding amplifying stage transistor.*

*74. An amplifier as recited in claim 73 and comprising another transistor having a base and an emitter constituting said diode,*

*said last-recited emitter being connected to said first-recited emitter electrode,*

*said feedback network being direct-current coupled to said first-recited emitter electrode through said base and emitter of said another transistor.*

*75. A transistor power amplifier for high-fidelity music reproduction without audible distortion or listening fatigue under extended critical listening conditions and comprising*

*a single-ended push-pull output stage having a first output terminal for direct-current coupling said stage to one end of a loudspeaker or other load,*

*a power supply connected to said output stage,*

*a second output terminal for direct-current coupling the other end of said load to said power supply,*

*a preceding amplifying stage comprising a transistor having a base electrode and an emitter electrode,*

*an active network direct-current coupling said preceding stage to said output stage,*

*a bias network maintaining one of said electrodes at a relatively fixed direct-current quiescent potential independent of variations in the load current or in the power supply potential,*

*and a negative feedback network responsive to the potential of said first output terminal and direct-current coupled to the other electrode for applying thereto a potential proportional to the direct-current quiescent potential of said first output terminal to maintain said quiescent potential substantially equal to that of said second output terminal, and wherein*

*said preceding amplifying stage transistor is connected in the common-emitter mode,*

*said active network including*

*a push-pull drive stage comprising a pair of complementary drive transistors each having an emitter, and*

*means connecting said emitters to said output terminal whereby said drive and output stages together effectively operate in the emitter-follower mode, and wherein*

*said output stage comprises a pair of output transistors of the same polarity type and each having a base and an emitter,*

*one of said drive transistors having an emitter direct-current coupled to the base of a respective one of said output transistors,*

*the other of said drive transistors having a collector direct-current coupled to the base of the other output transistor,*

*the emitter of said one output transistor being connected to said first output terminal,*

*said power supply having an ungrounded supply terminal, and*

*conductive means connecting the emitter of said other output transistor to said ungrounded power supply terminal, and wherein*

*said preceding common-emitter amplifying stage transistor has a collector and an emitter and is of a predetermined polarity type,*

*a second common-emitter amplifying stage including a transistor of a polarity type opposite to that of said*

*preceding amplifying stage transistor and having a base and a collector,*

*said first common-emitter transistor collector being direct-current-coupled to said second common-emitter transistor base,*

*said second common-emitter transistor collector being direct-current-coupled to said drive stage,*

*said bias network maintaining said base electrode of said first common-emitter preceding amplifying stage transistor at said relatively fixed direct-current quiescent potential and including a resistor extending from said base electrode to ground,*

*said negative feedback network being direct-current-coupled to said emitter electrode of the first common-emitter preceding amplifying stage transistor,*

*said feedback network including a feedback resistor for transmitting a feedback signal in the back direction toward said last-recited emitter electrode, and*

*conductive means separate from said feedback resistor and connected to said emitter electrode for conducting at least a substantial portion of the emitter current of said first common-emitter preceding amplifying stage transistor.*

*76. A transistor power amplifier for high fidelity music reproduction without audible distortion or listening fatigue under extended critical listening conditions and comprising*

*a single-ended push-pull output stage including at least two transistors connected in series at a midpoint of the stage,*

*a split power supply connected to said output stage and having a center-tap,*

*a pair of output terminals,*

*means D.C.-coupling one of said output terminals to said center-tap,*

*means D.C.-coupling the other output terminal to said output stage midpoint,*

*a complementary-symmetry push-pull drive stage,*

*means D.C.-coupling said drive stage to said output stage,*

*amplification means,*

*means D.C.-coupling said amplification means to said drive stage,*

*a D.C. feedback network extending from said output stage to said amplification means for maintaining said output terminals at substantially the same D.C. potential,*

*said amplification means comprising two common-emitter stages direct-current-coupled in cascade,*

*a first of said common-emitter stages including at least one transistor of a predetermined polarity type and connected in the common-emitter phase-reversing mode and having a base, a collector and an emitter,*

*the second of said common-emitter stages including a transistor of the opposite polarity type and connected in the common-emitter phase-reversing mode and having a base direct-current-coupled to said first common-emitter stage transistor collector and having a collector direct-current-coupled to said drive stage,*

*said first common-emitter stage having a base bias network for maintaining said transistor base thereof at a relatively fixed direct-current quiescent potential,*

*said base bias network comprising a resistor extending from said transistor base to ground,*

*said first common-emitter stage having a feedback injection node direct-current-coupled to said emitter to apply a feedback signal effectively in series with the input signal so as to raise the input impedance of said first common-emitter stage in response to the injection of a negative feedback signal into said node,*

*said D.C. feedback network being direct-current-coupled to said feedback injection node.*

*77. A direct-current-coupled amplifier as set forth in claim 76 and capable of transmitting a large low-frequency signal, and further comprising a dissipation-limiting protective circuit to prevent the operating point of the output stage from entering at least one of the regions of high dissipation.*

*78. An amplifier as set forth in claim 77 wherein said dissipation-limiting protective circuit comprises*

*a current-sensing resistor in series with the load and for conducting and sensing the instantaneous load current,*

*a protective transistor having a base-emitter junction and a collector,*

*said drive stage comprising a pair of drive transistors, one of said drive transistors having a base,*

*a subnetwork connected to said base for transmitting an input signal to the latter whereby the A.C. signal voltage at the base is substantially the same as that at a node of the subnetwork,*

*means connecting said protective transistor collector to said subnetwork node,*

*a second network tending to forward-bias said protective transistor base-emitter junction in response to the magnitude of the load current flowing through said resistive means in one direction with respect to the load, and*

*a third network tending to reverse-bias said protective transistor base-emitter junction proportional to the magnitude of the voltage swing of said other output terminal in one direction,*

*said third network being inoperative and providing no reverse bias when said output terminals are short-circuited.*

*79. An amplifier as set forth in claim 78 wherein*

*said second network includes conductors connecting the protective transistor base to one end of said current-sensing resistor and the protective transistor emitter to the other end of said current-sensing resistor, and*

*said third network includes a conductor network connecting the protective transistor emitter to said one output terminal to cause the voltage of said emitter to swing in the direction of the voltage swing of said one output terminal, and further including a conductive path extending from the protective transistor base to a node at approximately ground potential.*

*80. An amplifier as recited in claim 76 wherein*

*said D.C. feedback network comprises a first resistor, a second resistor and a capacitor,*

*said first resistor having one end direct-current-coupled to said output stage midpoint and its other end direct-current-coupled to said feedback injection node,*

*said second resistor having one end connected to said other end of said first resistor and its other end connected to one end of said capacitor,*

*the other end of said capacitor being connected to ground,*

*whereby said D.C. feedback network injects into said node both a D.C. feedback signal and an A.C. feedback signal with the magnitude of the D.C. feedback signal being substantially greater than the magnitude of the A.C. feedback signal, thereby minimizing*

*the D.C. offset at said output terminals and maximizing the A.C. feedback stability of the amplifier.*

*81. A transistor power amplifier as set forth in claim 80 wherein*

*said output stage comprises a pair of output transistors of the same polarity type,*

*each of said output transistors having a base, an emitter and a collector,*

*means connecting the collector of a first of said output transistors to a first of said power supply terminals,*

*means connecting the emitter of said first output transistor to said output terminal,*

*means connecting the collector of the second output transistor to said output terminal,*

*means connecting the emitter of the second output transistor to the second power supply terminal,*

*means direct-current-coupling the emitter of a first of said drive stage transistors to the base of said first output transistor, and*

*means direct-current-coupling the collector of the second drive stage transistor to the base of said second output transistor.*

*82. A transistor power amplifier as set forth in claim 81 and comprising*

*a dissipation-limiting protective circuit including current-sensing resistive means in series with said output terminal and said load,*

*a pair of complementary protective transistors each having a base-emitter junction and a collector,*

*a pair of diodes each connecting the collector of a respective one of said protective transistors to the amplifier network extending between the collector output of the second common emitter stage and the drive stage,*

*means tending to forward-bias a respective one of said protective transistor base-emitter junctions in response to the magnitude of the load current flowing through said resistive means in a respective direction,*

*a node maintained at a potential approximately midway between the potentials of said power supply terminals, and*

*first conductive means connecting the protective transistor bases to said node and second conductive means connecting the protective transistor emitters to said output stage midpoint so as to apply to a respective one of said protective transistor base-emitter junctions a voltage proportional to the voltage swing of the output stage midpoint and tending to reverse-bias said respective base-emitter junction.*

*83. An amplifier as recited in claim 76 wherein*

*said first common-emitter stage comprises another transistor of said predetermined polarity type and having a diode including as base and an emitter,*

*said last-recited emitter being coupled to the emitter of said first-recited common-emitter stage transistor,*

*said feedback signal being transmitted in the feedback direction through said diode.*

*84. A direct-current-coupled amplifier as recited in claim 83 and capable of transmitting a large low-frequency transient signal such as is generated when a tone arm is dropped upon a record or when switching between signal sources or due to other causes, and further comprising a dissipation-limiting circuit to prevent the respective operating points of the output stage transistors from entering a region of high dissipation in response to said large low-frequency transient signal.*

*85. An amplifier as set forth in claim 84 wherein said dissipation-limiting protective circuit comprises*

*current-sensing resistive means in series with said other output terminal and the said load and for conducting and sensing the instantaneous load current,*

*a pair of protective transistors of complementary polarity and each having a base-emitter junction and a collector,*

*said second common-emitter stage transistor having a collector output network,*

*first means connecting one of said protective transistor collectors to said collector output network of the second common-emitter stage,*

*second means connecting the other of said protective transistor collectors to said collector output network of the second common-emitter stage,*

*first means tending to forward-bias one of said protective transistor base-emitter junctions in response to the magnitude of the load current flowing through said resistive means in one direction with respect to the load,*

*second means tending to forward-bias the other of said protective transistor base-emitter junctions in response to the magnitude of the load current flowing through said resistive means in the opposite direction with respect to the load,*

*third means tending to reverse-bias said one protective transistor base-emitter junction proportional to the magnitude of the voltage swing of said other terminal in one direction, and*

*fourth means tending to reverse-bias said other protective transistor base-emitter junction proportional to the magnitude of the voltage swing of said other terminal in the opposite direction.*

*86. An amplifier as set forth in claim 85 and comprising*

*a node maintained at approximately ground potential,*

*said third and fourth reverse-bias means including resistive means connecting said protective transistor bases to said node.*

*87. An amplifier as set forth in claim 86 wherein each of said first and second connecting means comprises a diode connected between the respective protective transistor collector and said second common-emitter stage collector output network.*

*88. An amplifier as recited in claim 76,*

*said first common-emitter transistor having a base electrode and an emitter electrode and having a quiescent base-emitter potential difference between said electrodes,*

*said base bias network resistor constituting a first resistive means associated with said base electrode and having a first quiescent voltage thereacross,*

*said center-tap being substantially at ground potential,*

*a second resistive means associated with said emitter electrode and constituting at least part of said feedback network and having one end connected to said other output terminal and having a second quiescent voltage thereacross,*

*network means for maintaining the quiescent potential of one of said electrodes at a level displaced from ground potential by an amount substantially equal to the sum of said quiescent base-emitter potential difference and said quiescent voltage across the resistive means associated with said other network electrode to maintain the quiescent voltage of the output at substantially ground potential, and*

*means for direct-current coupling the other end of said second resistive means to said emitter electrode to transmit said feedback signal to the latter in the back direction and the voltage across said coupling means being of a magnitude to enable said other output terminal quiescent voltage to be maintained at substantially the same ground potential as said one output terminal.*

*89. An amplifier as recited in claim 88 wherein*

*said last-recited direct-current-coupling means comprises a diode junction,*

*said first common-emitter stage comprising a second transistor having a base-emitter junction constituting said diode junction and having a base and an emitter coupled to the emitter of the first-recited transistor of the first common-emitter stage,*

*said second resistive means being connected to said base of said second transistor of the first common-emitter stage.*

*90. An amplifier as recited in claim 88 wherein*

*said last-recited direct-current-coupling means comprises a direct conductive connection of the other end of said second resistive means to said emitter electrode.*

*91. A transistor power amplifier for high-fidelity music reproduction without audible distortion or listening fatigue under extended critical listening conditions and comprising*

*a first amplifier stage including an input circuit and an output circuit,*

*an output stage having a first output terminal for direct-coupling to one terminal of a loudspeaker or other load,*

*a power supply connected to said output stage,*

*a second output terminal for direct-current-coupling to the other terminal of said load,*

*first circuit means direct-current-coupling said first amplifier stage output circuit to said output stage to drive the latter,*

*a substantially fixed source of reference potential of a magnitude substantially independent of variations in the potential of said power supply,*

*second circuit means connected to said reference potential source and said first amplifier stage input circuit to supply bias current thereto at a relatively fixed quiescent potential so as to adjust the quiescent potential of said first output terminal to that of said second output terminal,*

*a node having a direct-current potential varying substantially proportionately to that of said first output terminal,*

*and a passive feedback impedance direct-current-coupled between said node and said first amplifier stage,*

*thereby providing a direct-current negative feedback loop to reduce any tendency of the quiescent potential of said first output terminal to vary from that of said second output terminal,*

*said first amplifier stage comprising a differential pair of transistors including a first transistor and a second transistor,*

*said first transistor being connected in the common-emitter node and having a collector forming part of said first amplifier stage output circuit whereby the signal at said collector is transmitted to said output stage,*

*said first transistor having a base forming part of said first amplifier stage input circuit,*

*a ground constituting said reference potential source,*

*said second circuit means including a resistor connected between said ground and said first transistor base,*

*said first and second transistors having mutually connected emitters,*

*said second transistor having a base,*

*said passive feedback impedance being direct-current-coupled to said second transistor base,*

*said output stage including at least a pair of output transistors connected in a push-pull arrangement and each having a base,*

*said first circuit means including a push-pull drive stage having at least two complementary transistors each direct-current-coupled to a respective one of said output transistor bases,*

*said drive and output stages being connected to operate in the emitter-follower mode.*

*92. An amplifier as recited in claim 91 wherein*

*said second output terminal is directly connected to said ground,*

*a second common-emitter transistor having a base direct-current-coupled to said first transistor collector and having a collector,*

*said second common-emitter transistor being of a polarity type opposite to that of said first transistor,*

*each of said two drive stage transistors having a base,*

*third circuit means direct-current-coupling said second common-emitter transistor collector to said drive stage transistor bases, and*

*means for transmitting an input signal to said first transistor base.*

*93. A transistor power amplifier for high-fidelity music reproduction without audible distortion or listening fatigue under vigorously critical extended listening conditions and comprising*

*a single-ended push-pull output stage having a first output terminal for direct-current-coupling said stage to one end of a loudspeaker or other load,*

*a power supply connected to said output stage,*

*a second output terminal for direct-current-coupling the other end of said load to said power supply,*

*a preceding amplifying stage comprising a transistor having a base electrode and an emitter electrode,*

*an active network direct-current-coupling said preceding stage to said output stage,*

*a bias network maintaining one of said electrodes at a relatively fixed direct-current quiescent potential independent of variations in the load current or in the power supply potential, and*

*a negative feedback network responsive to the potential of said first output terminal and direct-current-coupled to the other electrode for applying thereto a potential proportional to the direct-current quiescent potential of said first output terminal to maintain said quiescent potential substantially equal to that of said second output terminal, and wherein*

*said preceding amplifying stage transistor is of a predetermined polarity type and connected in the common-emitter mode so as to constitute a first common-emitter transistor,*

*said active network including a second common-emitter stage having only a single amplifying transistor of a polarity type opposite to that of said first common-emitter transistor and having an emitter and a collector output network,*

*a push-pull drive stage including a pair of complementary transistors each having a base, an emitter and a collector,*

*said second common-emitter transistor collector output network being direct-current-coupled to said bases of the drive stage transistors,*

*said power supply having positive and negative terminals,*

*conductive means connecting said emitter of said second common-emitter stage transistor to one of said supply terminals to maintain the potential of said emitter at approximately the potential of said supply terminal,*

*means connecting said drive stage transistor collectors to said power supply terminals respectively,*

*means direct-current-coupling said drive stage to said output stage,*

*means connecting said drive stage transistor emitters to the output terminal whereby said drive and output stages operate in the emitter-follower mode,*

*said negative feedback network transmitting a feedback signal to said emitter electrode of said preceding amplifying stage transistor,*

*said bias network including a resistor having one end connected to said base electrode and its other end connected to ground,*

*said feedback network including a feedback resistor for transmitting a feedback signal in the back direction toward said last-recited emitter electrode, and*

*conductive means separate from said feedback resistor and connected to said emitter electrode for conducting at least a substantial portion of the emitter current of said first common-emitter preceding amplifying stage transistor.*

*94. A transistor power amplifier as set forth in claim 93 wherein*

*said output stage comprises a pair of output transistors of the same polarity type,*

*each of said output transistors having a base, an emitter and a collector,*

*means connecting the collector of a first of said output transistors to a first of said power supply terminals,*

*means connecting the emitter of said first output transistor to said output terminal,*

*means connecting the collector of the second output transistor to said output terminal,*

*means connecting the emitter of the second output transistor to the second power supply terminal,*

*means direct-current-coupling the emitter of a first of said drive stage transistors to the base of said first output transistor, and*

*means direct-current-coupling the collector of the second drive stage transistor to the base of said second output transistor.*

*95. An amplifier as set forth in claim 93 wherein*

*said output stage comprises a pair of output transistors of the same polarity type,*

*each of said output transistors having a base, an emitter and a collector,*

*means connecting the collector of a first of said output transistors to a first of said power supply terminals,*

*means connecting the emitter of said first output transistor to said output terminal,*

*means connecting the collector of the second output transistor to said output terminal,*

*means connecting the emitter of the second output transistor to the second power supply terminal,*

*a push-pull emitter-follower second drive stage comprising a pair of transistors of the same polarity type as said output transistors and each having a collector, a base and an emitter,*

*means direct-current-coupling the emitter of a one of said first-recited drive stage transistors to the base of one of said emitter-follower drive stage transistors,*

*means direct-current-coupling the collector of the other of said first-recited drive stage transistors to the base of the other of said emitter-follower drive stage transistors, and*

*means direct-current-coupling the emitter of each of said emitter-follower drive stage transistors to the base of a respective one of said output transistors.*

*96. An amplifier as recited in claim 93 wherein*

*said first common-emitter stage has a high-frequency roll-off at a predetermined frequency,*

*said second common-emitter stage having a high-frequency roll-off at a second frequency substantially lower than said predetermined frequency,*

*whereby a large amount of feedback may be utilized with stability because of the low-frequency stability margin provided by the direct-coupling, in cooperation with the high-frequency stability margin provided by the relative respective high-frequency roll-offs of the first and second common-emitter stages.*

*97. An amplifier as recited in claim 96 wherein said high-frequency roll-off of said second common-emitter stage is provided by a capacitor connected between the collector and base of the second common-emitter stage transistor.*

*98. An amplifier as recited in claim 96 wherein said drive stage comprises a pair of complementary transistors each having an emitter connected to said output terminal whereby the drive and output stages operate in the emitter-follower mode so as to increase said high-frequency stability margin.*

*99. A pair of amplifiers each as recited in claim 93,*

*each of said amplifiers having individual input and output terminals so as to constitute an independent channel,*

*means for connecting said two amplifiers either in a separate mode or in a series mode,*

*means for connecting the output terminals of one amplifier to a first loudspeaker and the output terminals of the other amplifier to a second loudspeaker when said amplifiers are connected in said separate mode,*

*means for transmitting a first input signal to the input of said one amplifier and a second input signal to the input terminals of said other amplifier when said amplifiers are connected in said separate mode,*

*means for connecting an output terminal of one amplifier to one terminal of a loudspeaker and an output terminal of the other amplifier to the other terminal of the same loudspeaker when said amplifiers are connected in said series mode, and*

*means for transmitting an input signal to the input terminals of said one amplifier and an oppositely-phased replica of said input signal to the input terminals of said other amplifier when said amplifiers are connected in said series mode.*

*100. A transistor power amplifier for high-fidelity music reproduction without audible distortion or listening fatigue under extended critical listening conditions and comprising*

*a single-ended push-pull output stage having a first output terminal for direct-current-coupling said stage to one end of a loudspeaker or other load,*

*a power supply connected to said output stage,*

*a second output terminal for direct-current coupling the other end of said load to said power supply,*

*a preceding amplifying stage comprising a transistor having a base electrode and an emitter electrode,*

*an active network direct-current-coupling said preceding stage to said output stage,*

*a bias network maintaining one of said electrodes at a relatively fixed direct-current quiescent potential independent of variations in the load current or in the power supply potential,*

*and a negative feedback network responsive to the potential of said first output terminal and direct-current-coupled to the other electrode for applying thereto a potential proportional to the direct-current quiescent potential of said first output terminal to maintain said quiescent potential substantially equal to that of said second output terminal, and wherein*

*said preceding amplifying stage transistor is connected in the common-emitter mode,*

*said active network including a push-pull drive stage comprising a pair of complementary drive transistors each having an emitter and a base,*

*means connecting said emitters to said output terminal whereby said drive and output stages together effectively operate in the emitter-follower mode,*

*said preceding common-emitter amplifying stage transistor having a collector and an emitter and being of a predetermined polarity type,*

*a second common-emitter amplifying stage including a transistor of a polarity type opposite to that of said preceding amplifying stage transistor and having a base and a collector,*

*said preceding common-emitter transistor collector being direct-current-coupled to said second common-emitter transistor base,*

*network means direct-current-coupling said second common-emitter transistor collector to said drive stage transistor bases,*

*said bias network maintaining said base electrode of said first common-emitter preceding amplifying stage transistor at said relatively fixed direct-current quiescent potential and including a resistor extending from said base electrode to ground,*

*said negative feedback network transmitting a direct-current feedback signal to said emitter electrode of the first common-emitter preceding amplifying stage transistor,*

*said feedback network comprising a first resistor, a second resistor and a capacitor,*

*said first resistor having one end direct-current-coupled to said output stage midpoint,*

*said second resistor having one end connected to the other end of said first resistor and its other end connected to one end of said capacitor,*

*the other end of said capacitor being connected to ground,*

*said output stage comprising a pair of output transistors of the same polarity type and each having a base and an emitter,*

*one of said drive transistors having an emitter direct-current-coupled to the base of a respective one of said output transistors,*

*the other of said drive transistors having a collector direct-current-coupled to the base of the other output transistor,*

*conductive means connecting the emitter of said one output transistor to said first output terminal,*

*said power supply having a supply terminal ungrounded with respect to D.C.,*

*conductive means connecting the emitter of said other output transistor to said ungrounded power supply terminal.*

*101. A direct-current-coupled amplifier as recited in claim 100 capable of transmitting a large low-frequency signal and further comprising a dissipation-limiting circuit to prevent the respective operating points of the output stage transistors from entering a region of high dissipation in response to said low-frequency signal,*

*current-sensing resistive means in series with said output terminals and said load and for conducting and sensing the instantaneous load current,*

*a pair of protective transistors of complementary polarity and each having a base-emitter junction and a collector,*

*means connecting each of said protective transistor collectors to a node preceding said drive stage,*

*first means tending to forward-bias one of said protective transistor base-emitter junctions in response to the magnitude of the load current flowing through said resistive means in one direction with respect to the load,*

*second means tending to forward-bias the other of said protective transistor base-emitter junctions in response to the magnitude of the load current flowing through said resistive means in the opposite direction with respect to the load,*

*third means activated when the output terminals are not shorted and tending to reverse-bias said one protective transistor base-emitter junction proportional to the magnitude of the voltage swing of said first output terminal in one direction, and*

*fourth means activated when the output terminals are not shorted and tending to reverse-bias said other protective transistor base-emitter junction proportional to the magnitude of the voltage swing of said first output terminal in the opposite direction,*

*a node maintained at approximately ground potential,*

*said third and fourth reverse-bias means including a conductive path connecting the protective transistor bases to said node and means connecting the protective transistor emitters to said first output terminal.*

*102. An amplifier as recited in claim 101 wherein said connecting means comprises diodes connecting said protective transistor collectors to said network means which direct-current-couple said second common-emitter transistor collector to said drive transistor bases.*

* * * * *